US010672045B2

(12) United States Patent
Grivetti

(10) Patent No.: US 10,672,045 B2
(45) Date of Patent: *Jun. 2, 2020

(54) SYSTEMS AND METHODS FOR PROCESSING ORDERS FOR STRUCTURAL DESIGNS

(71) Applicant: Caterpillar Inc., Peoria, IL (US)

(72) Inventor: Tazio S. Grivetti, Chillicothe, IL (US)

(73) Assignee: Caterpillar Inc., Peoria, IL (US)

( * ) Notice: Subject to any disclaimer, the term of this patent is extended or adjusted under 35 U.S.C. 154(b) by 1025 days.

This patent is subject to a terminal disclaimer.

(21) Appl. No.: 14/851,286

(22) Filed: Sep. 11, 2015

(65) Prior Publication Data
US 2017/0076258 A1 Mar. 16, 2017

(51) Int. Cl.
G06Q 40/00 (2012.01)
G06Q 30/06 (2012.01)
G05B 19/4099 (2006.01)
G06F 30/13 (2020.01)
B33Y 50/02 (2015.01)

(52) U.S. Cl.
CPC ......... *G06Q 30/06* (2013.01); *G05B 19/4099* (2013.01); *G06F 30/13* (2020.01); *B33Y 50/02* (2014.12)

(58) Field of Classification Search
USPC ............. 705/39, 26; 235/379; 700/98; 703/1
See application file for complete search history.

(56) References Cited

U.S. PATENT DOCUMENTS

| 8,161,411 | B2 | 4/2012 | Robbin et al. | |
| 8,843,352 | B2* | 9/2014 | Kaufmann | G06F 30/13 703/2 |
| 2010/0198563 | A1 | 8/2010 | Plewe | |
| 2013/0046512 | A1* | 2/2013 | Kaufmann | G06F 30/13 703/1 |
| 2014/0067609 | A1 | 3/2014 | Heger | |
| 2015/0154575 | A1 | 6/2015 | Krieger | |

FOREIGN PATENT DOCUMENTS

| KR | 1020130032339 | 4/2013 |
| WO | 2014146052 | 9/2014 |

* cited by examiner

*Primary Examiner* — Tien C Nguyen
(74) *Attorney, Agent, or Firm* — Bookoff McAndrews

(57) ABSTRACT

A method includes receiving a plurality of design files at a computer-based system, wherein each of the design files is indicative of a respective structural design, a structural value associated with the respective structural design, and a source identifier associated with a designer of the respective structural design; causing a graphical representation of at least a portion of the structural designs to be displayed to a user; receiving a user selection of a first structural design of the displayed structural designs; generating an additive manufacturing file indicative of the first structural design in a predefined format, wherein the predefined format enables the processing of the additive manufacturing file into a physical structure through an additive manufacturing process; transmitting the selected first structural design in the predefined format; and determining, by the computer based system, a royalty value associated with the selected first structural design based at least on the structural value, the source identifier, and one or more additional parameters.

20 Claims, 9 Drawing Sheets

SYSTEMS AND METHODS FOR PROCESSING ORDERS FOR STRUCTURAL DESIGNS

TECHNICAL FIELD

The present disclosure generally relates to a computer-based system. More particularly, the present disclosure relates to the computer-based system providing assistance to designers and customers for three-dimensional constructions.

BACKGROUND

Recently, technologies related to constructing structures such as, buildings, houses, and the like using additive manufacturing machines, also referred to as three-dimensional (3D) printing machines, have been developed. Typically, in such cases, a design of the structure may be provided to the 3D printing machine, which may deposit and extrude a material to build the structure according to the design. Moreover, the design may include layer-by-layer sliced format. Such designs may be developed by designers, structural engineers, and the like. However, it may be difficult for these designers to get their work in front of a broad audience for review and possible purchase by customers. Further, the customers may be able to view only a simple model or pictures of the purchased designs.

For reference, U.S. Pat. No. 8,161,411 is related to improved graphical user interfaces (hereinafter the GUI's of the '411 patent) suitable for reviewing, browsing, previewing and/or purchasing media items. The graphical user interfaces are suitable for reviewing or browsing numerous media items. The graphical user interfaces are also suitable for previewing or purchasing media items in an on-line manner. The graphical user interfaces are particularly useful for a system that provides purchase and distribution of media in a client-server environment.

However, the GUI's of the '411 patent may not provide an analysis of each of the media items so as to facilitate a user to make a decision on the purchase of a particular media item. Further, the GUI's of the '411 patent does not allow integrating and/or viewing information relating to the distribution of 3D printed structures that may have an effect on the subsequent purchases made by one or more users. These and other shortcomings of the prior art are addressed by the present disclosure.

SUMMARY

In an aspect, a method may include receiving a plurality of design files at a computer-based system, wherein each of the design files is indicative of a respective structural design, a structural value associated with the respective structural design, and a source identifier associated with a designer of the respective structural design; causing a graphical representation of at least a portion of the structural designs to be displayed to a user; receiving a user selection of a first structural design of the displayed structural designs; generating an additive manufacturing file indicative of the first structural design in a predefined format, wherein the predefined format enables the processing of the additive manufacturing file into a physical structure through an additive manufacturing process; transmitting the selected first structural design in the predefined format; and determining, by the computer based system, a royalty value associated with the selected first structural design based at least on the structural value, the source identifier, and one or more additional parameters.

In another aspect, a method may include receiving a plurality of design files at a computer-based system, wherein each of the design files is indicative of a respective structural design, a structural value associated with the respective structural design, and a source identifier associated with a designer of the respective structural design; causing a graphical representation of at least a portion of the structural designs to be displayed to a user; receiving a user selection of a first structural design of the displayed structural designs; causing a design option to be displayed to the user; receiving a user selection of the design option; generating an additive manufacturing file indicative of the first structural design in a predefined format, wherein the predefined format enables the processing of the additive manufacturing file into a physical structure through an additive manufacturing process; transmitting the selected first structural design in the predefined format; and determining, by the computer based system, a royalty value associated with the selected first structural design based at least on the structural value, the source identifier, and the selected design option.

In yet another aspect, this disclosure is directed to a method. The method may include receiving a plurality of design files at a computer-based system, wherein each of the design files is indicative of a respective structural design, a structural value associated with the respective structural design, and a source identifier associated with a designer of the respective structural design; causing a graphical representation of at least a portion of the structural designs to be displayed to a user; receiving a user selection of a first structural design of the displayed structural designs; generating an additive manufacturing file indicative of the first structural design in a predefined format, wherein the predefined format enables the processing of the additive manufacturing file into a physical structure through an additive manufacturing process; causing a transmission option to be displayed to the user; receiving a selection of the transmission option; transmitting the selected first structural design in the predefined format; and determining, by the computer based system, a royalty value associated with the selected first structural design based at least on the structural value, the source identifier, and the selected transmission option.

Other features and aspects of this disclosure will be apparent from the following description and the accompanying drawings.

DETAILED DESCRIPTION

Additive manufacturing, or 3D printing, can be used to form various components from small plastic toys to vehicle parts, medical devices, and even building structures such as homes and protective structures. Currently, designs to be printed using a 3D printer are prepared and printed as a service to the end user. Customization of components may require the direct commissioning of a designer and printer.

The present disclosure relates to a computer platform and design tool for designers to prepare and upload any number of 3D design components to a network portal. Customers can access the network portal to review and purchase any number of the designs in the uploaded catalogue of designs. Customers can view various designs and options including a parts list and/or ancillary structural components such as doors, windows, connectors, and the like. Such options can be associated with partners/provides and can be offered to the customer via the portal. The 3D designs can be manipulated in a 3D rendering and a sliced rendering to allow a complete review of the design.

For example, a credit value can be to each of the designs. The credit value may be a parameter on which a royalty for the design may be calculated. The credit value may be a cost of the design. The credit value and resultant royalty may be based on the analysis of the strength criteria of the design. For example, the designs that have passed the strength criteria may be assigned the credit value. The credit value may be assigned further based on various other parameters such as, a time for the 3D printing machine to complete the extrusion, the material used for the construction, cost of the material and others. The credit value may be based on popularity for the design or other social factors.

The structural designs can be selected for purchase and add-ons, customizations, replacements, and the like can be presented to the customer for consideration. The virtual structure can be processed to be transmitted as a local download, to a printing apparatus/machine, to a builder, or to the customer (e.g., SD card). Depending on the action taken (e.g., download, storage, copy, actual printing) various costs can be paid by the customer and/or various royalties can be provided to the attributed designer(s).

Figure 1:
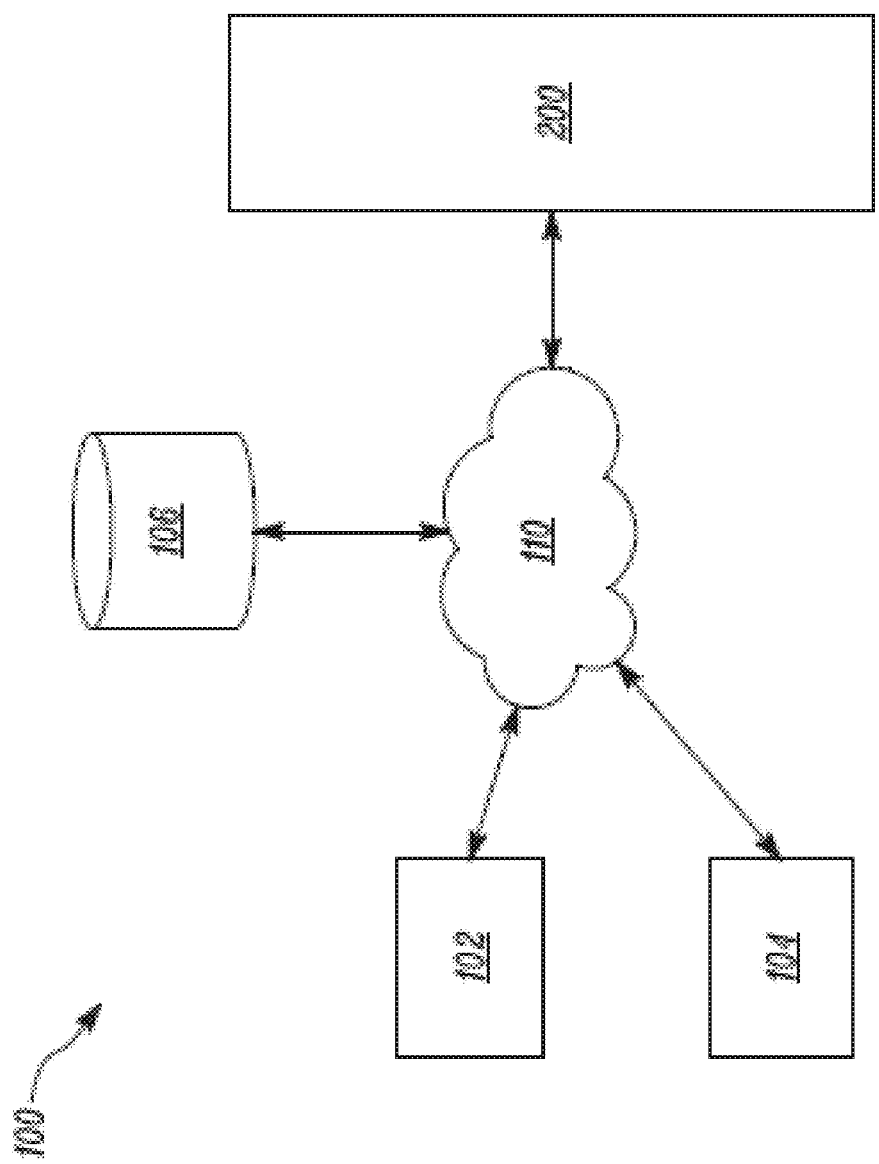
FIG. 1 is a block diagram of an exemplary environment in which a three-dimensional (3D) construction assistance module may be deployed, according to an aspect of the present disclosure.

Now referring to the drawings, wherein like reference numbers refer to like elements, there is illustrated an exemplary environment 100 in which the present disclosure may be utilized, in accordance with an aspect of the disclosure. As shown in FIG. 1, for example, the environment 100 includes a first user 102, a second user 104, a database 106, and a communication network 110. The first user 102, the second user 104, and the database 106 may communicate with each other over the communication network 110. Examples of the communication network 110 may include, but are not limited to, a wide area network (WAN), a local area network (LAN), an Ethernet, Internet, an Intranet, a cellular network, a satellite network, or any other suitable network for transmitting data. The communication network 110 may be implemented as a wired network, a wireless network, or a combination thereof.

The first user 102 and the second user 104 may comprise any hardware and/or software suitably configured to facilitate input, receipt and/or review of information relating to a 3D construction assistance program or any information discussed herein. The database 106 may include any device (e.g., personal computer) that communicates (in any manner discussed herein) with the first user 102 and the second user 104 via any network discussed herein. These computing units or systems may take the form of a computer or set of computers, although other types of computing units or systems may be used, including laptops, notebooks, handheld computers, mobile devices, set-top boxes, workstations, computer-servers, main frame computers, mini-computers, PC servers, pervasive computers, network sets of computers, or the like. Practitioners will appreciate that the database 106 may or may not be in direct contact with the first and second users 102, 104. For example, the first user 102 or the second user 104 may access the services of the database 106 through a remote server, which may have a direct or indirect connection to the communication network 110.

As those skilled in the art will appreciate, the first user 102 or the second user 104 may include an operating system (e.g., Windows NT, 95/98/2000, OS2, UNIX, Linux, Solaris, MacOS, etc.), various conventional support software, or drivers typically associated with computers. Further, the first user 102 or the second user 104 may include any suitable personal computer, network computer, workstation, minicomputer, mainframe, tablet, mobile device, or the like. Furthermore, the first user 102 or the second user 104 may be in a home, business environment, or public place with access to a network (e.g., airport). In an exemplary aspect, network access is available through a commercial web-browser software package.

In an exemplary implementation as shown in FIG. 1, a 3D construction assistance module 200 (hereinafter "the assistance module 200") may be communicatively coupled to the first user 102 via the communication network 110. In an aspect, the assistance module 200 may be deployed on one or more servers associated with the first user 102 or the second user 104. In another aspect, the assistance module 200 may be deployed as a separate entity on a third-party server.

The database 106 may be configured to store design information, such as initial concept design files, work in progress design files, completed design files, or approved design files that may have passed the strength criteria for each of the first users 102. The design information may also include files of working components or completed components associated with each of the first user 102. The database 106 may also be configured to store various hardware files related to each of the design files, such as, for example, designs of ancillary components associated with the designs. In an example, the ancillary components may include a doorway or window lintel, hinges, fasteners, or the like that may be designed to be partially or completely encompassed by the extruded material during the 3D construction.

Further, the database 106 may also include data related to user profiles for each of the first user 102 or the second user 104. For example, the user profile may include a name, an address, or contact details such as e-mail address, phone number, correspondence address, social security number, or the like. Further, the database 106 may also be configured to store transaction history of the users, account receivable information, credit bureau information, transaction account data associated with the second users 104, one or more preference settings of the users, or data from any third-party sources. For example, the database 106 may also store account history of the second user 104, such as designs viewed by the second user 104, designs saved/archived for later review, designs purchased by the second user 104, or the like. In various aspects, the assistance module 200 may be in communication with various third-party sources to retrieve the relevant information.

The user profile may include a building history. The building history may include a history of all design purchases and builds associated with the user. The building history may include a compilation of building updates related to the manufacture, installation, or use of the building. For example, the building information may contain a record of breaks, repairs, sales, or the like.

Building updates may include any information related to the manufacturing, use, or physical condition of the building. Building updates may include a difficulty to obtain a material, ancillary component, or tool associated with the structural design, including whether the material, component, or tool was ultimately obtained, the identity of any suppliers contacted in relation to this difficulty, or any modifications to the design during manufacture to account for this difficulty. Building updates may include modifications of the structural design of the building, including those made during the design selection, those occurring during manufacture, and aftermarket modifications; valuation information, including the sales history, market value, appraisals, inspections of the building, or a valuation of the structure; trends in the market, including features and styles that are moving in or out of popularity and valuations based on an aesthetic of the structural design; repairs, renovations, upgrades, or replacements, including structural repairs, the problem solved by the repair/renovation/upgrade/replacement, what other solutions were considered, and why the particular solution was chosen, including any parts or service companies involved; structural deterioration information, including the wear-and-tear of the building, significant weather or climates the building has withstood, including damage to the structure and the weather condition that caused the damage; upkeep information, including electricity demands, water demands, or the like; major overhauls of the building, including structural modifications, add-ons, or teardown of part or all of the building; or any other type of information related to the building or its structural design.

A user may request custom building modification, for example, during manufacturing of the structure. As such, the structural design may be modified in real-time and transmitted to the printing machine for correction. As a further example, on-demand modifications may be factored into cost and royalty payment to the designer. Variable delivery options may be offered at varying costs, considering speed of modification and overall build time.

As different data may be relevant for different types of users, user profiles may depend upon the type of the second user 104, or the second user 104's reason for accessing the assistance module 200. The user types include customers, like small-scale and large-scale customers; dealers that provide materials, components, machines, machine parts, or manpower; and designers that design, modify, or evaluate structural designs. One or more user profiles or user-profile types may be associated with the second user 104. For example, the second user 104 may have a designer profile and a customer profile.

The designer profile may be associated with designers and may include data related to the designs created, modified, or evaluated by the designer. For example, the first user 102 may have a design profile. The design profile may include data related to the designs associated with the first user 102. For example, designs created or modified by the first user 102 may be included. Royalties that the designer has earned based on the sale of designs may be tracked in the designer profile. Further, any information related to the analysis of these designs, including the structural value and the structural criteria may be included. The designer profile may log the sales of designs by the first user 102, including all structures built based on the designs. The design profile may also capture and modifications that the second user 104 makes to the structural design prior to purchase. Building updates related to the designs of the first user 102 may also be included in the user profile.

The customer profile may be used by an entity interested in manufacturing, purchasing, or leasing a structure. The customer profile may be designed for use by individuals or small building companies, such as the second user 104 that is developing one or a few structures (e.g., for resale or lease). The customer profile may be designed for resellers, such as architects or contractors, companies or individuals who will be using the structural designs to build multiple structures (e.g., for resale or lease), including developers who are building entire communities. The customer profile may include the designs viewed, archived, saved, or purchased by the second user 104. The customer profile may include information related to the available resources of the second user 104, such as materials, ancillary components, machines, machine parts, manpower, or the like. The customer profile may specify the location of the available resources. The customer profile may also include data related to licenses and permits associated with the second user 104. The customer profile may include data related to previous builds, including order information, sales contracts, or resources used. The customer profile may also include data relating to structures built based on the designs, including the locations of past builds, available build sites, and building updates.

The dealer profile may be used by any entity supplies materials, tools, parts, or manpower for manufacturing a structure based on a structural design. A dealer profile may be for component dealers, machine dealers, or manufacturing dealers. A component dealer may supply, manufacture, or sell ancillary components, materials, or additive manufacturing machine parts. A machine dealer may repair, sell, or rent additive manufacturing machines or other tools. A manufacturing dealer may provide services for manufacturing structures based on the design files, including manpower, construction supervisors, operators, appraisers, inspectors, or the like. The dealer profile may include inventory information, including the locations of the inventory. The dealer profile may include repair history for additive manufacturing machines or other tools. The dealer profile may include sales or rental records. The dealer profile may also associate materials, components, manpower, or machines with the structures that have been built using the particular resource or the structural designs that have used the particular resource to create structures. Building updates related to the structures or structural designs associated with the dealer's resources may also be included in the user profile.

The database 106 may employ any type of database, such as relational, hierarchical, graphical, object-oriented, or other database configurations. Common database products that may be used to implement the database 106 include DB2 by IBM (White Plains, N.Y.), various database products available from Oracle Corporation (Redwood Shores, Calif.), Microsoft Access or Microsoft SQL Server by Microsoft Corporation (Redmond, Wash.), or any other suitable database product. Moreover, the databases 106 may be organized in any suitable manner, for example, as data tables or lookup tables. Each record may be a single file, a series of files, a linked series of data fields, or any other data structure. Association of certain data may be accomplished through any desired data association technique, such as those known or practiced in the art. For example, the association may be accomplished either manually or automatically. Automatic association techniques may include, for example, a database search, a database merge, GREP, AGREP, SQL, using a key field in the tables to speed searches, sequential searches through all the tables and files, sorting records in the file according to a known order to simplify lookup, or the like. The association step may be accomplished by a database merge function, for example, using a "primary key field" (hereinafter "key field"), in pre-selected databases or data sectors.

More particularly, a key field may partition the database 106 according to the high-level class of objects defined by the key field. For example, certain types of data may be designated as a key field in a plurality of related data tables, and the data tables may then be linked on the basis of the type of data in the key field. The data corresponding to the key field in each of the linked data tables is preferably the same or of the same type. However, data tables having similar, though not identical, data in the key fields may also be linked by using AGREP, for example. In accordance with one aspect of the disclosure, any suitable data storage technique may be utilized to store data without a standard format. Data sets may be stored using any suitable technique, including, for example, storing individual files using an ISO/IEC 7816-4 file structure; implementing a domain whereby a dedicated file is selected that exposes one or more elementary files containing one or more data sets; using data sets stored in individual files using a hierarchical filing system; data sets stored as records in a single file (including compression, SQL accessible, hashed via one or more keys, numeric, alphabetical by first tuple, etc.); Binary Large Object (BLOB); stored as ungrouped data elements encoded using ISO/IEC 7816-6 data elements; stored as ungrouped data elements encoded using ISO/IEC Abstract Syntax Notation (ASN.1) as in ISO/IEC 8824 and 8825; or other proprietary techniques, which may include fractal compression methods, image compression methods, or the like.

In one exemplary aspect, the ability to store a wide variety of information in different formats is facilitated by storing the information as a BLOB. Thus, any binary information can be stored in a storage space associated with a data set. As discussed above, the binary information may be stored on the financial transaction instrument or external to but affiliated with the financial transaction instrument. The BLOB method may store data sets as ungrouped data elements formatted as a block of binary via a fixed memory offset using one of fixed storage allocation, circular queue techniques, or best practices with respect to memory management (e.g., paged memory, least recently used). By using BLOB methods, the ability to store various data sets that have different formats facilitates the storage of data associated with the system by multiple and unrelated owners of the data sets. For example, a first data set, which may be stored, may be provided by a first party, a second data set, which may be stored, may be provided by an unrelated second party, and yet a third data set, which may be stored, may be provided by a third party unrelated to the first and second party. Each of these three example data sets may contain different information that is stored using different data storage formats or techniques. Further, each data set may contain subsets of data that also may be distinct from other subsets.

As stated above, in various aspects of the database 106, the data can be stored without regard to a common format. However, in one exemplary aspect of the disclosure, the data set (e.g., BLOB) may be annotated in a standard manner when provided for manipulating the data onto the financial transaction instrument. The annotation may comprise a short header, trailer, or other appropriate indicator related to each data set that is configured to convey information useful in managing the various data sets. For example, the annotation may be called a "condition header," "header," "trailer," or "status," herein, and may comprise an indication of the status of the data set or may include an identifier correlated to a specific issuer or owner of the data. In one example, the first three bytes of each data set BLOB may be configured or configurable to indicate the status of that particular data set: e.g., LOADED, INITIALIZED, READY, BLOCKED, REMOVABLE, or DELETED. Subsequent bytes of data may be used to indicate for example, the identity of the issuer, user, transaction/membership account identifier, or the like. Each of these condition annotations are further discussed herein.

The data set annotation may also be used for other types of status information as well as various other purposes. For example, the data set annotation may include security information establishing access levels. The access levels may, for example, be configured to permit only certain individuals, levels of employees, companies, or other entities to access data sets, or to permit access to specific data sets based on at least the transaction, the first user 102, the second user 104, or the like. Furthermore, the security information may restrict/permit only certain actions such as accessing, modifying, or deleting data sets. In one example, the data set annotation indicates that only the data set owner or the user are permitted to delete a data set, various identified users may be permitted to access the data set for reading, and others are altogether excluded from accessing the data set. However, other access restriction parameters may also be used allowing various entities to access a data set with various permission levels as appropriate. The data, including the header or trailer, may be received by a standalone interaction device configured to add, delete, modify, or augment the data in accordance with the header or trailer. As such, in one aspect, the header or trailer is not stored on the transaction device along with the associated issuer-owned data, but instead the appropriate action may be taken by providing, to the transaction instrument user at the standalone device, the appropriate option for the action to be taken. The database 106 contemplates a data storage arrangement wherein the header or trailer, or header or trailer history, of the data is stored on the transaction instrument in relation to the appropriate data. One skilled in the art will also appreciate that, for security reasons, any databases, systems, devices, servers, or other components of the database 106 may consist of any combination thereof at a single location or at multiple locations, wherein each database or system includes any of various suitable security features, such as firewalls, access codes, encryption, decryption, compression, decompression, or the like.

The disclosure may be described herein in terms of functional block components, screenshots, optional selections, and various processing steps. It should be appreciated that such functional blocks may be realized by any number of hardware or software components configured to perform the specified functions. For example, the assistance module 200 may employ various integrated circuit components, e.g., memory elements, processing elements, logic elements, look-up tables, or the like, which may carry out a variety of functions under the control of one or more microprocessors or other control devices. Similarly, the software elements of the assistance module 200 may be implemented with any programming or scripting language such as C, C++, Java, COBOL, assembler, PERL, Visual Basic, SQL Stored Procedures, or extensible markup language (XML), with the various algorithms being implemented with any combination of data structures, objects, processes, routines, or other programming elements. Further, it should be noted that the assistance module 200 may employ any number of conventional techniques for data transmission, signaling, data processing, network control, or the like. Still further, the assistance module 200 could be used to detect or prevent security issues with a client-side scripting language, such as JavaScript, VBScript, or the like.

These software elements may be loaded onto a general-purpose computer, special-purpose purpose computer, or other programmable data processing apparatus to produce a machine, such that the instructions that execute on the computer or other programmable data-processing apparatus create means for implementing the functions specified in the flowchart block or blocks. These computer program instructions may also be stored in a computer-readable memory that can direct a computer or other programmable data-processing apparatus to function in a particular manner, such that the instructions stored in the computer-readable memory produce an article of manufacture including instruction means that implement the function specified in the flowchart block or blocks. The computer program instructions may also be loaded onto a computer or other programmable data-processing apparatus to cause a series of operational steps to be performed on the computer or other programmable apparatus to produce a computer-implemented process, such that the instructions that execute on the computer or other programmable apparatus provide steps for implementing the functions specified in the flowchart block or blocks.

In an aspect, the computer program instructions may be executed on any remote-hosted application framework, for example, by a processor associated with a cloud server. Accordingly, the first user 102 or the second user 104 may access the cloud server via any interfaces connected to the Internet.

Figure 2:
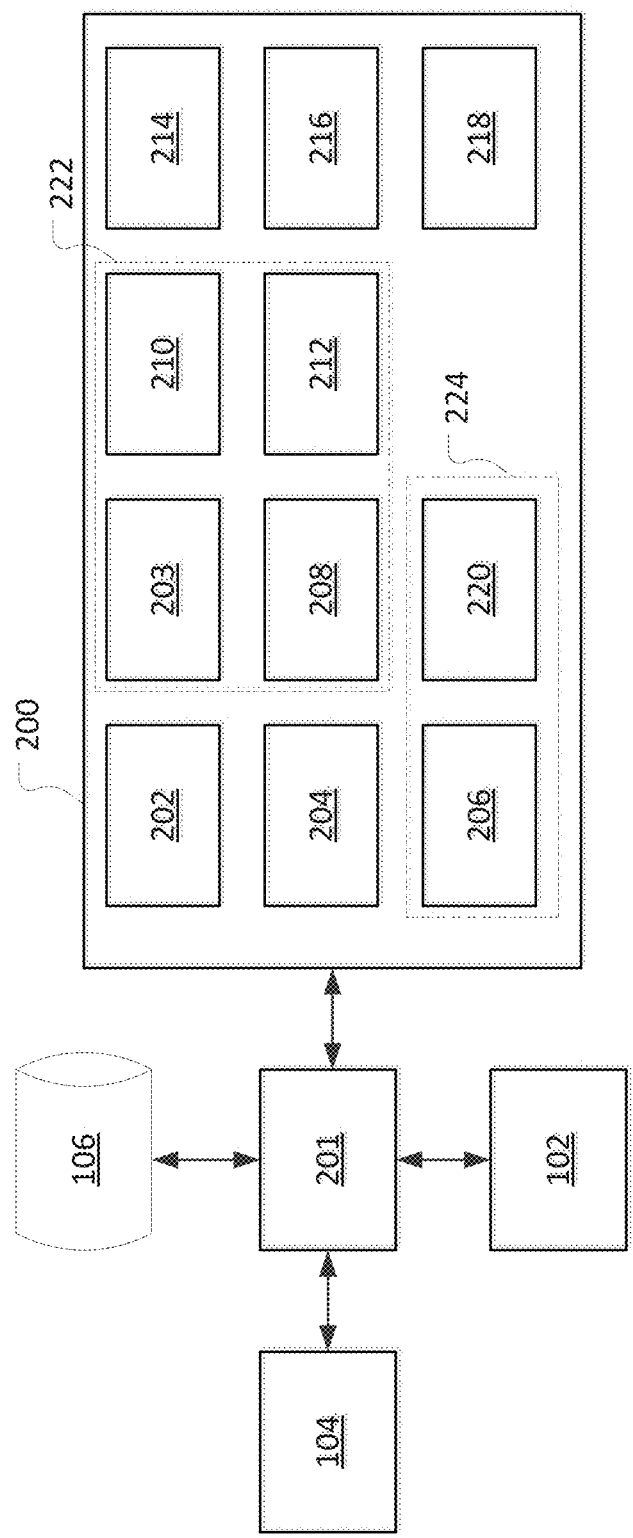
FIG. 2 is a block diagram illustrating an exemplary implementation of the 3D construction assistance module, according to an aspect of the present disclosure.
Figure 3:
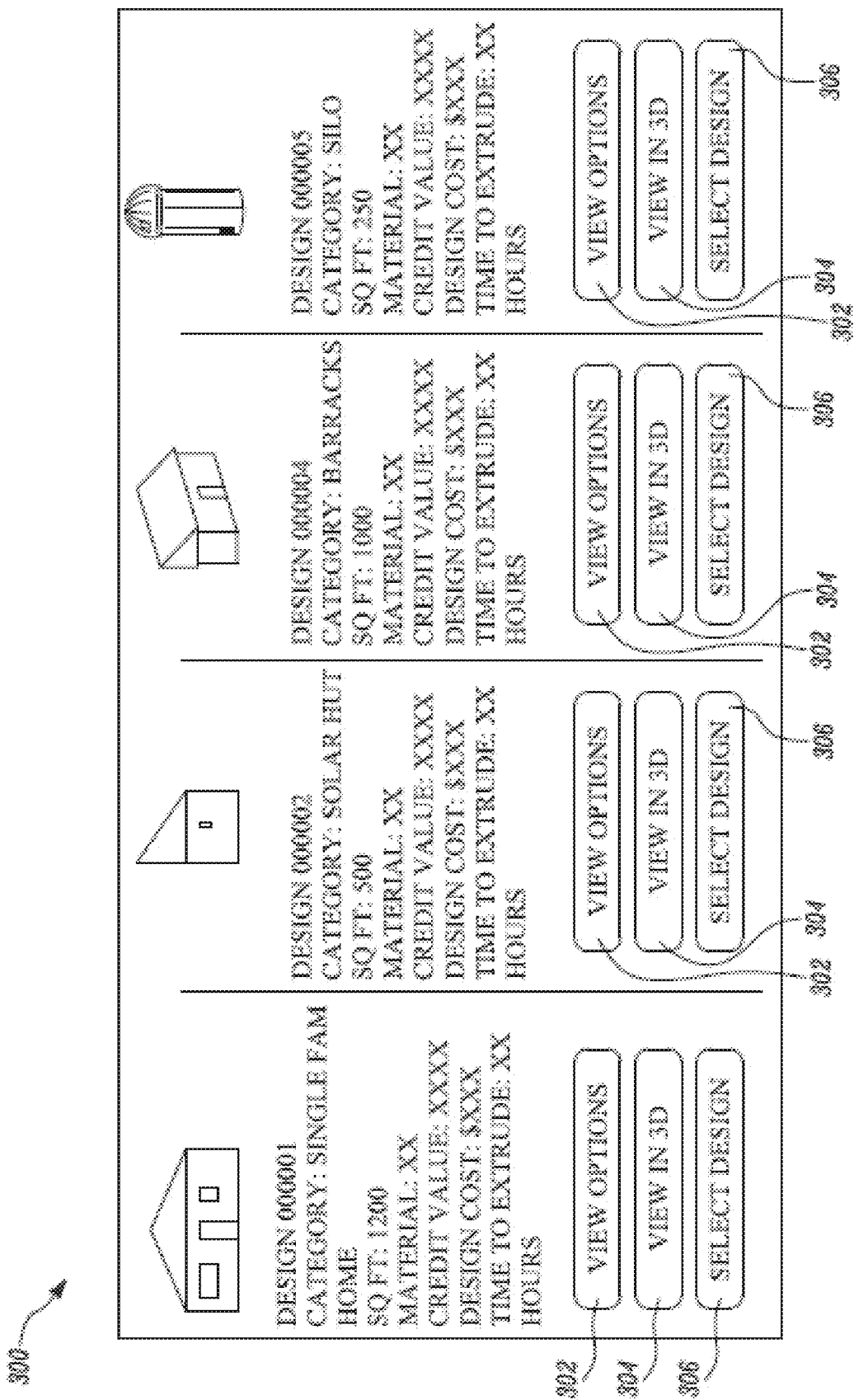
FIG. 3 is an exemplary output displayed on an exemplary graphical user interface (GUI) associated with the 3D construction assistance module, according to an aspect of the present disclosure.

Referring to FIG. 2, an exemplary implementation of the assistance module 200 is depicted, according to an aspect of the present disclosure. In the illustrated aspect, the assistance module 200 includes a design module 202, a user interface 203, a sorting module 204, an analytics engine 206, a display module 208, a selecting module 210, a building module 212, a transform module 214, a download module 216, a payment module 218, and a feedback system 220, as shown. In an aspect, one or more of the design module 202, the user interface 203, the sorting module 204, the analytics engine 206, the display module 208, the selecting module 210, the building module 212, the transform module 214, the download module 216, the payment module 218, or the feedback system 220 may include software instructions stored on memory to be run on a processor. The assistance module 200 may be associated with a graphical user interface (GUI) 300. (An example GUI 300 is shown in FIG. 3.) The assistance module 200 may be communicatively coupled to a server 201. For example, a portion or the entire assistance module 200 may be stored in memory of the server 201 or in memory communicatively coupled to the server 201. In an example, the server 201 may be a web-based server. Further, the assistance module 200 may be configured to communicate with the database 106 or other third-party sources through the communication network 110, as illustrated in FIG. 1.

As will be understood, the modules of the assistance module 200 discussed above may be arranged in any combination. For example, the user interface 203 may be integrated into design module 202. Likewise, the user interface 203 may be incorporated into the display module 208.

In an aspect, the design module 202 may be configured to receive one or more designs from the first user 102. For example, the first user 102 may provide a design file to the design module 202, wherein the design file contains or is indicative of a structural design. In one aspect, the design module 202 may enable the first user 102 to upload designs via the user interface 203. Additionally or alternatively, the design module 202 may enable the first user 102 to build or save the designs. Designs that the first user 102 has built, uploaded, or saved may be associated with the user profile of the first user 102.

The design module 202 may also enable the first user 102 to modify the designs. As an example, the design module 202 may also enable the first user 102 to modify other designs available through the design module 202, such as designs received from another user. The design module 202 may enable the first user 102 to combine features or components of one or more designs to create a new design or modify an existing design. Designs that the first user 102 does has modified may be associated with the user profile of the first user 103. Additionally or alternatively, the modifications the first user 102 has made may be associated with the user profile of the original designer of the design that the first user 102 has modified.

Accordingly, the design module 202 may comprise a design tool to enable the first user 102 to build one or more designs. In an example, the software may be an open-source building tool, such as LeoCAD, LDraw™, or the like. As another example, the first user 102 may use other third-party software, such as AutoCAD®, PTC Creo®, SOLIDWORKS®, or the like. The first user 102 may build one or more designs using the design module 202. The software associated with the design module 202 may be used by the first user 102 to develop one or more designs in a standard format. For example, a design file indicative of a structural design may be in a standard format, which may include a proprietary format of the assistance module 200. As another example, the design module 202 may convert a design file of a different format into the standard format. In an aspect, the design module 202 may navigate to an external platform that hosts the software to enable the first user 102 to build one or more designs.

The designs, as discussed herein, may include designs for various structures and components of structures. Designs may encompass a complete structure (e.g., a building), or a component of a structure. In an aspect, the designs may further include features, such as a layout for an electrical wiring within the structures. Additionally, the designs may also include layouts for various other features, such as passageways for cabling, drainage, venting, plumbing, HVAC systems, windows, doorways, or the like. Accordingly, the designs may be used to construct the physical structures that include the corresponding features therein via the 3D construction machines. The designs may also include a foundation or footer, or information relating to appropriate ground conditions onto which the material for the structure may be deposited.

In an aspect, the assistance module 200 may be configured with functions utilized in creating the designs. The design module 202 may provide information relating to a design modification (e.g., a change to the structural design) or implementation detail (e.g., how to build a structure based on the structural design) to the first user 102. Additionally or alternatively, the design module 202 may automatically incorporate the design modification or implementation detail. Alternatively, the GUI 300 (FIG. 3) may allow the first user 102 to incorporate the design modification or implementation detail into the structural design. In such a case, the design module 202 may be configured to receive design modifications or implementation details via the GUI 300 (FIG. 3).

For example, the design module 202 may identify one or more modifications of the design based on at least data received from the analytics engine 206. Once the design module 202 identifies one or more modifications, the design module 202 may provide the modification(s) to the first user 102 as an alert, a message, or the like. These modifications may include adjustments to certain measurements, such as joint angles, wall thicknesses, or the like. These modifications may be identified based on any desirable criteria, including manufacturing costs, structural integrity, heating and cooling costs of the structure, certain design requirements, or the like. These modifications may be identified based on information in the user profile of the first user 102. For example, if previous designs of the first user 102 that included a porch have historically been more popular than the previous designs of the first user 102 that did not include a porch, the modification may include adding a porch to the present design.

As another example, the design module 202 may determine other implementation details. Implementation details may include any aspect or detail of actually implementing a structure based on the structural design. Once the design module 202 identifies one or more implementation details, the design module 202 may provide these criteria to the first user 102 as an alert, a message, or the like. The implementation details may include location information for the building, such as the positioning or orientation of the structure. The location information may be identified by the design module 202 based on any desirable criteria, including manufacturing costs, structural integrity, heating/cooling costs of the structure, certain design requirements, or the like. These implementations may be identified based on information in the user profile of the first user 102. For example, if previous designs of the first user 102 have been used with a first type of additive manufacturing machine, the implementation detail may identify using that additive manufacturing machine to build the structure based on that design.

The analytics engine 206 or the design module 202 may include or be communicatively coupled to the sorting module 204. The sorting module 204 may be configured to sort each of the designs into a category based on at least the type of the physical structure associated with the designs. For example, the category may include a building type. For example, a building category may encompass a single-family home type, a multi-family home type, a but type, a silo type, a decorative archway type, a column type, a pavilion type, a pergola type, a gazebo type, a porch type, a water feature type, a water storage type, a fortification, a storage building type, a shed type, a shelter, a multi-story building type, a cellar type, a masonry oven type, an animal housing type, a barrack type, or a garage type, or the like. These subcategories may be grouped generally as a building type. Structures may be categorized based on multiple categories or subcategories.

Components (as opposed to complete structures) may be categorized as a component type, or by a specific component category. The category may include a part or a component of the physical structure, for example a component category may encompass a roof, wall, ceiling, column, support beam, staircase, chimney, building expansion, such as an add-on porch, or any other portion of a building or structure. These components may be grouped generally as a component type. Additionally or alternatively, components may be categorized based on at least more specific categories, such as categories devoted to a specific type of component (e.g., roof).

The sorting module 204 may sort a design into one or more categories or subcategories. Categories and subcategories may be based on at least any feature of a structure, including aesthetics, designs that can be made out of a certain type of material, designs that are appropriate for certain geographic areas or climates, designs having certain uses, designs having certain electrical requirements, design or manufacturing cost, or any other feature that may be considered by a builder or consumer when searching for designs. Categories and subcategories can be based on at least a design style (e.g., Tudor), how long it takes for an additive manufacturing machine to extrude the design, the type of additive manufacturing machine or machine components required, whether the design can be packaged (e.g., flat packed) for transport and assembled at its destination, or the like. Categories and subcategories can be based on at least factors that may be relevant to the ultimate owner, such as an estimated cost of heating or cooling the structure, the power requirements of the structure, or any other feature. For example, a design for a single-family home that is designed to be or capable of being mounted on stilts may be included in a hurricane-proof category, a building category, or a single-family home category.

A structural design received through the user interface 203 or developed using the design module 202, including any modifications thereof, may be provided to the analytics engine 206. The analytics engine 206 may be configured to analyze a structural criterion of the design. The analysis may be based on at least one criterion or multiple criteria. For example, the structural criteria may include one or more of a strength criterion, a cost criterion, an aesthetic criterion, a material grade, or the like. An exemplary combination may include multiple strength criteria, a cost criterion, and multiple aesthetic criteria. Any combination of structural criteria, including a single criterion, is within the scope of this disclosure.

Structural criteria may include any objective or subjective criteria relating to the design. The structural criteria may be standard for all designs. For example, structural criteria may include strength criteria. Alternatively or additionally, the structural criteria may be dependent on one or more features of the design. For example, structural criteria or structural analysis of a silo may use different factors or formulas than would be used to perform structural analysis of a but or a wall.

The analytics engine 206 may analyze the strength criteria by performing structural analysis on the designs. Structural analysis may be performed based on generally known structural analysis methods. The structural analysis may be based on one or more fundamental relations, such as equilibrium, constitutive, or compatibility. For example, the structural analysis may use simple linear elastic models or more complex differential equations to examine one or more of support reactions, stresses, and displacements. The structural analysis methods may make use of one or more of the mechanics of materials approach, the elasticity theory approach, or numerical approximation, such as the finite element approach. One or more types of analysis may be performed to evaluate the strength criteria, including those used in materials science, construction engineering, earthquake engineering, mechanical engineering, or civil engineering applications. The strength criterion may be evaluated via a panel of experts, where the results may be aggregated to determine a final strength value for the particular design.

Strength criteria may include multiple types of criteria in addition to or instead of structural analysis methods that are generally known. For example, strength criteria may consider the different types of environments or climates a design is appropriate for. For example, this type of analysis may consider factors related to how insulated a design is (e.g., based on at least the thickness or materials of outer walls); how well it can withstand rain, high winds, flooding, earthquakes, or any combination thereof; how well it can withstand certain environmental materials, such as sand, acid rain, or other forms of pollution; how much weight, volume, or other measurement of load the design may handle (e.g., storage capability of a silo or the maximum weight of snow a roof can withstand); or any combination thereof. Any criteria related to the strength or durability may be considered.

Alternatively or additionally, the structural criteria may depend on data received by the feedback system 220. For example, the feedback system 220 may obtain data related to actual implementations of the structural designs, and the structural criteria may depend on these actual implementations. The functionality of obtaining this data is discussed in further detail below with respect to the feedback system 220. In this manner, the analytics engine 206 and the feedback system 220 may operate as a structural analytics system 224 that analyzes structural designs based on real-world implementations of the same or similar designs.

Data from the feedback system 220 may be used to correct or improve structural analysis of the structure. That is, structural analysis based on numerical models may prove to be inaccurate when compared to data from the feedback system 220, or structural analysis may only provide a predication within a range of values. Thus, the data from the feedback system 220 may be used to calibrate the results of the structural analysis of the structural design so that they are more aligned with real-world implementation of these structures. For example, the structural analysis may be conservative, and predict that the roof of the structural design may only be able to withstand 500 kg of force without compromising the structure. However, if the feedback system 220 receives data that indicates structures based on the structural design are consistently able to withstand heavy snowfalls that drop 1000 kg of snow on the structure, the structural analysis may be corrected to increase the maximum load of the roof.

The analytics engine 206 may approve the design if the corresponding design passes the associated strength criteria. Accordingly, these designs may be included in a list of approved designs for the associated first user 102. This information may be stored in the user profile of the first user 102. Moreover, the designs that have passed the structural analysis may be uploaded to the database 106 for display to the second users 104. The analytics engine 206 may determine the design as not approved if the corresponding design fails the associated strength criteria requirement. For example, if the strength criteria of the design do not meet the minimum requirements, the first user 102 may be notified. In an aspect, the design module 202 may receive a modification of the structural design from the first user 102. In another aspect, the design module 202 may propose a modification of the structural design to the first user 102. The user may modify the structural design using the design module 202 through the user interface 203. The user may modify the structural design in the standard format, regardless of the format the design was first provided by the first user 102. In another aspect, the design module 202 may be configured to automatically modify the design to improve the structural criteria of the design.

The structural criteria may include other criteria in addition to, or instead of, the strength criteria. Structural criteria may include cost criteria. Cost criteria may relate to the cost of manufacturing the design. For example, the cost criteria may consider the cost of materials, labor costs, the cost of equipment rental, or the like. The cost criteria may factor in differences in cost based on at least the location of the structure to be manufactured based on at least the design. The cost criteria may factor in shipping costs. The cost criteria may include overall quality of the design. Designs that are meant to last for decades, for example, may have better quality criteria than designs for structures that will not last as long under the same conditions. Cost criteria may consider whether the design includes or is capable of certain modifications to decrease the cost. For example, that a design that is available in a grade A material but can also be manufactured in a grade B material may be considered in developing the cost criteria of the design. In an aspect, a more cost-effective design may have better cost criteria than a similar design that is more costly. As another example, designs that provide the most quality for the cost may have better cost criteria. As another example, the lowest-cost designs may have more favorable criteria. Any methodology for determining and weighing factors that may be directly or indirectly related to cost associated with the design may be considered in determining the cost criteria of a design.

The structural criteria may include material grade. Material grade may be considered instead of, as part of, or separately from cost criteria. For example, designs to be made in a higher grade material may have a better or worse material grade criteria than designs made in a lower grade material. Additionally or alternatively, the variety of materials or range of material grades available may be factored into the analysis. Structural criteria related to the material grade may factor in the variety of materials used to manufacture a structure based on at least the design. It may factor in the general availability of the material to be used to manufacture a structure. For example, a material grade may be improved if the design uses generally available materials, as opposed to specialty products. As a specific example, the material grade of a design may be lower if the design requires materials or component parts that must be specially ordered. Any methodology for determining and weighing factors that may be directly or indirectly related to material grade associated with the design may be considered in determining the material grade of a design. As an example, various material compositions (e.g., loadings of components in the composition) may be known to increase strength or wear properties, but may affect the overall cost of the structure. Thus, options may be provided to a user to balance the strength and cost. As a user selects such options, the weight factors used by the analytics engine 206 may be adjusted to reflect the customized options selected by the user. Such options may include strength, speed, cost, and grade (e.g., military grade, hurricane grade, etc.), for example.

The structural criteria may include aesthetic criteria. For example, this criteria may be based on at least how universally pleasing a design is. These criteria may consider whether this design is aesthetically popular in only a small region. The criteria may consider how well the aesthetics of a design will age based on at least wear and tear of the structure during use. The aesthetic criteria may be based on at least how trendy or classic a design is. For example, while split-level houses were popular designs in the past, their popularity may have significantly decreased over time, while ranch-style houses may maintain a steadier popularity. The aesthetic criteria may consider how in-style the aesthetics of the design may be at present, or how popular the style it is expected to be in the future. Any methodology for determining and weighing factors that may be directly or indirectly related to aesthetics associated with the design may be considered in determining the aesthetic criteria of a design. As an example, the aesthetic criteria may be adjusted based on a selected surface treatment or finishing options. As a further example, grooves, polish, lattice, and other surface designs or treatments may be inputted by the designer and/or may be applied to base designs.

The analytics engine 206 may also be configured to determine other parameters related to each of the designs. In an aspect, the analytics engine 206 may be configured to determine an amount of material required for the 3D construction of the design. The analytics engine 206 may also be configured to determine a time required to extrude the material for the physical construction of the 3D construction of the design. Further, such parameters may be stored in the database 106 as discussed above.

The analytics engine 206 is further configured to assign the structural value to each of the designs. For example, the designs that have passed the strength criteria may be assigned the structural value. In an example, the structural value may be a parameter on which a royalty for the design may be calculated. In another example, the structural value may be based on at least a cost of the design. The analytics engine 206 may assign the structural value based on at least the analysis of the strength criteria of the design. The structural value may be assigned further based on at least various other parameters such as a time for the 3D printing machine to complete the extrusion, the material used for the construction, cost of the material, or the like. In an example, the analytics engine 206 may also assign the structural value further based on at least popularity for the design. Similarly, the analytics engine 206 may update the structural value based on at least the popularity of the design indicated by the number of sales of the design.

The analytics engine 206 may analyze the structural design to determine what ancillary components are required by the design. In an aspect, the analytics engine 206 may determine whether ancillary components that would meet the design requirements are available. For example, the analytics engine 206 may determine that, based on at least the width of a doorway, a standard door would not fit in the design. The analytics engine 206 may suggest one or more modifications to the design so that it only requires ancillary components that are available. The analytics engine 206 may identify different options for certain ancillary components. For example, the analytics engine 206 may identify one or more doors from one or more merchants, resellers, third-party providers, sellers, venders, or the like that would be able to be incorporated into the structure. The analytics engine 206 may associate the ordering information for the ancillary component with the structural design, wherein the ordering information is based on at least the third-party provider. The analytics engine 206 may also determine when certain ancillary products are discontinued, on backorder, or not available in the geographic location in which the structure is to be built. The analytics engine 206 may determine different cost options for different types of ancillary products. The analytics engine 206 may suggest a design modification based on at least an availability of an alternative ancillary component, if, for example, the ancillary component in the current design is not available. This information may be used by the first user 102 to modify the design. The availability, cost, or variety of ancillary components may factor into the structural analysis and may impact the structural value of the design.

Additionally or optionally, the analytics engine 206 may allow experts or other first users 102 to analyze the designs. In such a case, the analytics engine 206 may assign the structural value further based on at least the analysis by the expert users or the other first users 102. In an aspect, the analytics engine 206 may also be configured to assign a value points to the first user 102 based on at least a number of accepted designs and associated structural value, expertize, productivity, or other parameters.

As shown, the assistance module 200 is also in communication with the second user 104. The assistance module 200 may allow the second user 104 to provide one or more user inputs via the GUI 300. The assistance module 200 may include a buyer interface system 222. The buyer interface system 220 may include a portion or all of the user interface 203, the display module 208, the selecting module 210, or the building module 212. Additionally or alternatively, while not illustrated in FIG. 2, the buyer interface system 222 may include a portion or all of the design module 202, the sorting module 204, the analytics engine 206, the building module 212, the transform module 214, the download module 216, the payment module 218, or the feedback system 220.

The user interface 203 may be configured to allow the second user 104 to access or use the assistance module 200. The user interface system 203 may allow the second user 104 to register with the assistance module 200. After registration is completed, the second user 104 may access the assistance module 200 by providing security credentials. Once registered, the second user 104 may have a profile. The profile may include any information identifying or related to the second user 104, including name, contact information, billing information, shipping information, or the like.

The user interface 203 may include different types of user profiles, depending on the type of customer the second user 104 may be. For example, if the second user 104 is interested in buying a design, the second user 104 may have a customer profile. Designers, such as the first user 102, may have a design profile. Dealers, including sources of materials, components, parts, tools, machines, or manpower may have a dealer profile.

The user interface 203 may be customized based on the profile type associated with the second user 104. For example, the information displayed via the user interface 203 may vary depending on the type of profile. For example, in a customer profile, information related to available resources, including the second user 104's own inventory, may be provided. As another example, a dealer profile may display information identifying trends of the types of additive manufacturing machine tools that are currently in demand. In a designer profile, the user interface 203 may provide a list of the bestselling designs.

If the second user 104 is associated with more than one type of user profile, the user interface 203 may be customized to include some or all of the information that would be displayed under one user profile. For example, if the second user 104 is a component supplier as well as a designer, the user interface 203 may include information or tools specific to both of these roles. Any combination or integration of the functionality or features of multiple profiles may be used.

The display module 208 may be configured to allow the second user 104 to view each of the designs along with the associated category or the structural value. The display module 208 may be configured to display the design selected by the second user 104 on the GUI 300. In an aspect, the assistance module 200 may allow the second user 104 to view the designs based on at least an authentication, like security credentials provided by the second user 104. As illustrated, the output on the GUI 300 may include a design number, a category of the design, amount of material used, structural value, cost of the design, time to extrude the material, or the like. Further, the GUI 300 may also include control elements 302, 304 that may allow the user to provide input corresponding to viewing the design.

The control element 302 may allow the second user 104 to provide input corresponding to selecting view options related to the design. The view options may include options such as, zoom, pan, 3D rotate, or the like. The view options may also include viewing the design at various standard viewing angles such as, rear, front, left, top, bottom, isometric or the like. In an aspect, the view options may also include viewing the design based on at least dynamic view angles. For example, the view options may include viewing a roof, interiors, or the like of the structure, or viewing the design from various angles or orientations. The control element 304 may allow the second user 104 to provide input corresponding to viewing the design in 3D view.

The selecting module 210 may be configured to receive an input from the second user 104 to select one or more designs. In an aspect, the GUI 300 of the assistance module 200 may allow the user to provide input corresponding to selection of one or more designs. In the illustrated aspect, the GUI 300 includes a control element 306 that may allow the second user 104 to provide input corresponding to the selection of the particular design. In an aspect, the GUI 300 of the assistance module 200 may also allow the second user 104 to select parts of one or more designs. The GUI 300 may allow the second user 104 to select any of the design files, such as the designs received from the first user 102, the designs stored in the database 106, designs received through other third party sources, or the like.

At the selecting module 210, the second user 104 may provide additional information regarding the planned build. Further, selecting module 210 may allow the second user 104 to make modifications or additions to the structural design. For example, the second user 104 may change the material or ancillary components to be used to build the structure. In one aspect, the second user 104 may be able to combine multiple designs, or pick different parts of different designs. In this manner, the second user 104 may customize the design to fit his/her particular use. For example, the second user 104 may be able to modify the design to accommodate a wheelchair or the like. As another example, the second user 104 may modify the layout of a building to make a room larger or smaller. The second user 104 may add solar panels to the roof.

These changes, as well as other design choices, including the location of the planned build, the positioning of the planned build, the additive manufacturing machine to be used to build the structure, or any other design choice may impact the integrity of the structure. Thus the structural analysis of the original design developed by the analytics engine 206 may be recreated, modified, adjusted, or otherwise updated based on the inputs received from the second user 104. The user profile may indicate the planned geographic location of the building, and the analytics engine 206 may analyze the design based on the specific terrain. As another example, if the user profile or the second user 104 otherwise indicates that solar panels will be added to the design, the shade analysis of the planned geographic location may be determined. Any other factor that may be identified by the second user 104 regarding the building of the structure based on the structural design may be incorporated into the structural analysis or used to update the structural analysis performed by the analytics engine 206.

In adjusting the structural analysis based on the user inputs, the analytics engine 206 may consider the user profile. A structural analysis of the design based on data associated with the user profile, including data specifically related to the planned implementation of the building based on the structural design may be called the adjusted structural analysis. For example, cost analysis of the structure may depend upon the materials, ancillary components, or additive manufacturing machines the second user 104 owns or has access to.

It may be difficult for the general structural analysis of a structural design to properly account for every environment, location, or positioning of a structure. Thus the general structural analysis may be adjusted based on having more information regarding a specific planned implementation of the structure. As an example, if the second user 104 indicates the location of the planned build, the analytics engine 206 may adjust or update the structural analysis of the structural design to account for the potential or expected impact of the environment on the structure.

Data related to comparable structures may be incorporated into the structural analysis of the design. Comparable structures may share one or more characteristic with the structural design or the planned build based on the structural design. One or more building updates related to comparable structures may affect the structural analysis of the structural design. Once comparable structures and the relevant building updates are identified, the structural analysis of the structural design, such as the structural analysis performed when the structural design was uploaded by the first user 102, may be updated.

Comparable structures may be identified in any number of ways. For example, comparable structures may include structures built using the same structural design as the planned build will use. If the user profile provides more information regarding the planned build, in addition to the structural design, the comparable structures may be selected based on this information. For example, comparable structures may exist in a similar climate, a nearby geographic location, on similar terrain, or have similar neighbors. For example, the comparable structures may include structures that are built near bodies of water, as the planned build will abut a stream. As another example, comparable structures may be based on manufacturing criteria, such as materials, ancillary components, or additive manufacturing machine types used to build the structure.

Comparable structures need not be based on identical structural designs. For example, to evaluate the durability of the material to withstand salt water, comparable structures may be structurally distinct; a silo made of material A in Alaska may be a comparable structure to a two-story building to be built in Ottawa, at least for determining the durability of the material. As another example, comparable structures may be identified based on sharing a designer or builder. Thus, the analytics engine 206 may identify one or more similarities between the planned build and other structures to identify the comparable structures.

Building histories of the comparable structures may be factored into the structural analysis. In an aspect, only a subset of the building history of a comparable structure may be incorporated into the structural analysis. For example, the similarities between the planned build and the comparable structure may determine which building updates of the comparable structure are relevant to the analysis of the structural design of the planned build. For example, if the comparable structure and the structural design share a climate and material, the building updates related to the deterioration of the comparable structure may factor into the analysis. As another example, if the comparable structure and the structural design share a similar terrain, updates related to the foundation of the comparable structure may be included in the analysis.

The adjusted structural analysis may optionally include a projected repair schedule. The projected repair schedule for a structure based on the structural design may be developed based on the building history of comparable structures. The projected repair schedule may be associated with a climate or geographic area, based on the building history. For example, based on the repairs performed on similar or comparable buildings, the adjusted structural analysis may predict the type, cost, or timing of a repair to the structure based on the design.

Once the structural analysis has accounted for the information provided by the second user 104 regarding the particular planned build, the selecting module 210 may determine a design option based on the adjusted structural analysis. A design option may be a recommendation or option related to the particular planned build. The design option may be based on any data, including an analysis of the history of comparable structures, the planned location, the market preference, a component of the structural design, or a projected repair schedule. This data may be part of or in addition to the adjusted structural analysis.

For example, the design option may relate to the positioning information of the building. As an example, positioning information may be particularly relevant for the structural design if it has been indicated that the design will include solar panels or be powered by a micro-grid. For example, the adjusted structural analysis may indicate that the planned position the structure is just outside the reach of another existing micro-grid and that the existing micro-grid has excess capacity that could power the building. The design option may include a recommendation that the structure be moved so that it is within reach of this existing micro-grid. The design option may indicate a specific location of the building within the geographical location, an orientation of the structure, or the like.

As another example, the design option may relate to a design modification. The design option may recommend modifying the structural design based on the adjusted structural analysis. Additionally or alternatively, the design options may include all available design modifications. The available design modifications may be limited based on the adjusted structural analysis. The design option may indicate a reasoning or effect of a design modification. For example, if the modification is to increase the slant angle of the roof, the design option may indicate that the solar panels will be able to generate more electricity at that angle.

As another example, the design option may relate to a design addition. The design option may recommend adding to the structural design based on the adjusted structural analysis. Additionally or alternatively, the design options may include all available additions. The available design additions may be limited based on the adjusted structural analysis. The design option may indicate a reasoning or effect of a design addition. For example, if the addition is a second garage, the design option may indicate an increased property value for buildings with two garages.

The design option may relate to ancillary components. For example, the design option may include an ancillary component selection. This may include information related to what ancillary components are called for by the design, options for obtaining these components, or the like. The design option may enable the second user 104 to purchase or otherwise order the ancillary components through the selecting module 210. The design option may indicate that the projected repair schedule may be impacted based on incorporation of a particular ancillary component. The design option may relate to hardcopy papers such as blueprints or formal drawings prepared for submission to a local authority (e.g., pre-populate requisite forms) for building approval.

The design option may relate foundation, footers, or environmental base for the printing process. Compatible foundations may be offered to a user for select based on the location of the build site and/or the material to be used. Various grades of foundations may be offered to a user a options for the build site/build plan. Environmental considerations may be considered when suggesting compatible foundations. For example, if the build site is in Brazil, the build plan may include drilling holes, filling holes with concrete to establish "footers/columns" to support the printable structure. The design options/build plan may also include suggestions for allowing machine access to the build site and a position at the build site for initial deposition of material. The design options/build plan may be coordinated with other machines for preparing the build site for the deposition process. Such preparation may include building roads, clearing encumbrances, grading, and the like.

The building module 212 may be configured to receive an input from the second user 104 to build the virtual structure using the selected designs. The assistance module 200 may be associated with suitable software that may allow the second user 104 to build the virtual structure using a combination of the selected designs. In an example, the assistance module 200 may allow the second user 104 to build the virtual structure of a house using a design of a solar roof. In one example, the software may be integrated with the assistance module 200 so as to enable the second user 104 to build the virtual structure. In another example, the building module 212 may redirect to the corresponding software that may be hosted on other third party platforms.

Accordingly, the display module 208 may be in communication with the building module 212 to display the virtual structure on the GUI 300. The display module 208 may optionally show or otherwise provide the design option. Further, the building module 212 may also allow the second user 104 to modify the virtual structure by replacing the existing designs with other designs, identifying ancillary components for the design, modifying the design, or the like. For example, the second user 104 may select the design option through the display module 208.

The transform module 214 may be configured to transform the selected designs into a predefined format. In an aspect, the transform module 214 may be configured to integrate each of the selected designs into a single design and further transform the design into the predefined format. The transform module 214 may be configured to receive the structural design in the first format from the design module 202 and convert the structural design into a second format. For example, the transform module 214 may slice the design layer-by-layer into a format that can be used by an additive manufacturing machine to extrude, manufacture, or 3D print the structure.

The transform module 214 may be configured to generate a build plan based on the selected design. The build plan may be indicative of positioning of the planned structure, include the geographic location, a specific location within a geographic area, or an orientation of the structure. The build plan may include or otherwise be associated with the selected design. The build plan may identify a machine part, tool, or additive manufacturing machine for building the structure. The build plan may include a material list, an ancillary component list, or a builder list. The material or ancillary component list may identify sources of the materials or components, such as ordering information, or it may include an order form for already-purchased materials/components. The builder list may include a list of available personnel to build the structure, including manufacturers, operators, inspectors, civil engineers, or the like.

The download module 216 may allow the second user 104 to download build plan or the selected designs in the predefined format. The predefined format enables the processing of the selected designs into the physical structure through the 3D construction process. In an aspect, the predefined format may have a file extension that may be accessed by a predetermined type of 3D construction machine. In an example, the design files in the predefined format may be only accessed by 3D construction machines that are associated with a particular company for example, XYZ company. The analytics engine 206 is further configured to determine a royalty associated with the selected designs based at least in part on the structural value and one or more additional parameters. The analytics engine 206 may be in communication with the download module 216 to determine the designs that are selected for download. Accordingly, the analytics engine 206 may calculate the royalty for each of these selected designs. In an example, the royalty may be determined in terms of money. In another example, the royalty may be determined in terms of the structural values.

The payment module 218 may allow the second user 104 to make necessary payments that may be required to download the selected designs. In another aspect, the payment module 218 may be integrated with 3D construction machines that are used to build the physical structures based on at least the selected designs. Accordingly, the payment module 218 may allow the second user 104 or other users to make the necessary payments to use the downloaded designs with the 3D construction machines. In such an arrangement, the assistance module 200 may be in communication with the payment module 218 or the associated 3D construction machine. Further, the analytics engine 206 may accordingly calculate a payment value for the corresponding first users 102 based on at least a number of times the downloaded design is used and the royalty associated with the design.

In an aspect, the assistance module 200 may also allow the second user 104 to view ancillary components associated with each of the designs. For example, the ancillary components may include a doorway, window lintel, hinges, fasteners, or the like that may be designed to be partially or completely encompassed by the extruded material during the 3D construction. Further, the assistance module 200 may allow the second user 104 to select or purchase the ancillary components. Accordingly, the assistance module 200 may be associated with third-party dealers or companies that sell the ancillary components. In an aspect, the assistance module 200 may navigate to a purchase interface of the third party dealer to facilitate the second user 104 to purchase the ancillary components. In another aspect, the purchase interface of such dealers may be integrated with the assistance module 200, thereby facilitating the second user 104 to purchase the ancillary components via the GUI 300 of the assistance module 200.

In an aspect, the assistance module 200 may also provide details related to different dealers, for example, local representatives of an XYZ company that can provide assistance related to 3D construction machines, 3D construction process, or the like. Additionally or optionally, the GUI 300 may allow the second user 104 to communicate with these dealers for receiving the required assistance, such as an availability of the 3D construction machines, details of the processes, or the like. In an example, the assistance module 200 may also allow the second user 104, via the GUI 300, to select the dealer or the additive manufacturing machine for use in building the physical structure corresponding to the downloaded design.

Once a building is manufactured based on the downloaded design, the feedback system 220 may obtain or monitor information related to that building. This feedback may include information that a single-family home built based on the design was able to withstand more snow than previously thought without the roof caving in. Additionally or alternatively, this feedback may be subjective. A builder may indicate that he/she did not like the aesthetics of the design, or that in application, the aesthetics were not what was expected based on the design file. This feedback information may then be used to update the structural analysis of the structural design upon which the structure is based. Further, this feedback information may be used to identify the building as a comparable design and to update a structural analysis of a planned build consistent with the feedback generated from the building.

The feedback information may comprise building updates, and the building updates may be compiled into a building history. The building history may be associated with the specific building, the second user 104, the structural design, or the location of the building. The building history may include any type of information regarding a building. For example, the building history may include its design file; suppliers, parts, or personnel used to manufacturing the building, design characteristics of the building; or the build plan.

The building history may include building updates. Building updates may include any information related to the manufacturing, use, or physical condition of the building. Any quantifiable or qualifiable characteristic of the building may be incorporated into its building history. Building updates may relate to the design selection process by which the structural design is selected: modifications to the design, choices of one option over another, the inclusion of additional components, or the like. Building updates may relate to the manufacturing process of the building: the source and cost of ancillary components, materials, or tools; modifications to the design during the build process, such as substituted materials or components; or the like. Building updates may include after-market (e.g., after the original manufacture of the building) changes: renovations, add-ons, modifications of the design, or the like. Building updates may include information related to the value of the building:

depreciation, sales history, market value, appraisals, inspections of the building, or a valuation of the structure. Building updates may track market trends, including features and styles that are moving in or out of popularity and the impact of certain aesthetic choices on the valuation or marketability of the building. Building updates may include upkeep of the building: repairs, renovations, upgrades, or replacements. Building updates may track the deterioration of the building, including the wear-and-tear of the building, significant weather or climates the building has withstood, including damage to the structure and the weather condition that caused the damage. Building updates may also monitor upkeep information, including electricity demands, water demands, or the like. Building updates may also include any major overhauls of the building, including structural modifications, add-ons, or teardown of part or all of the building.

As discussed above, the structural criteria that the analytics engine 206 uses to analyze a structural design may include real-world implementation of buildings based on the structural design. This feedback information obtained by the feedback system 220 may be used to analyze the structural design. This feedback information may be used to update or adjust the structural design analysis. For example, as more real data is developed based on the structural design, it may be determined that the structural analysis is imprecise or inaccurate. In order to obtain the feedback information, building updates may be obtained. The assistance module 200 may receive a building update associated with a building. For example, the feedback system 220 may be configured to receive, process, and compile building updates into a building history.

The building update may be automatically generated, such as by a computer or sensor associated with the building or by data-mining property records, including building permits, tax information, and sales records. Additionally or alternatively, the building update may be added to the building profile by the second user 104. In another example, the building update may be based on information obtained from the current or previous owner of the building. A building update may include information developed or obtained by the assistance module 200. For example, if the second user 104 orders a replacement product or tool, an order confirmation may associate that order with a particular building.

The building update may be associated with the structural design of the building or the location of the building. The building history may be associated or reference building histories of comparable designs or structures. Comparable structures may be identified based on any combination of characteristics of the building. For example, comparable structures may include structures by the same dealer, existing in the same climate, or existing in the same geographic region. Comparable structures may also be identified based on use of the same design file, or design files that share certain similarities, the structural design type, add-ons, ancillary components, or any other feature. The building history may be used to develop a projected repair structure for comparable designs or to identify design options.

A person of ordinary skill in the art will acknowledge that the GUI 300 and the corresponding graphical control elements explained with reference to FIG. 3 are merely exemplary in nature and hence non-limiting of this disclosure. Moreover, design or functional modifications may be possible for the GUI 300 without deviating from the scope of the present disclosure.

Further, the environment 100 described above is to be considered as merely example and hence non-limiting of this disclosure. Moreover, the environment 100 may include any number of the databases 106, first users 102, second users 104, or networks 110. Although, the assistance module 200 is described to include multiple modules carrying different functions, it may be contemplated to include a single module, lesser number of modules, or even additional modules to implement the functions that are described herein.

Figure 4:
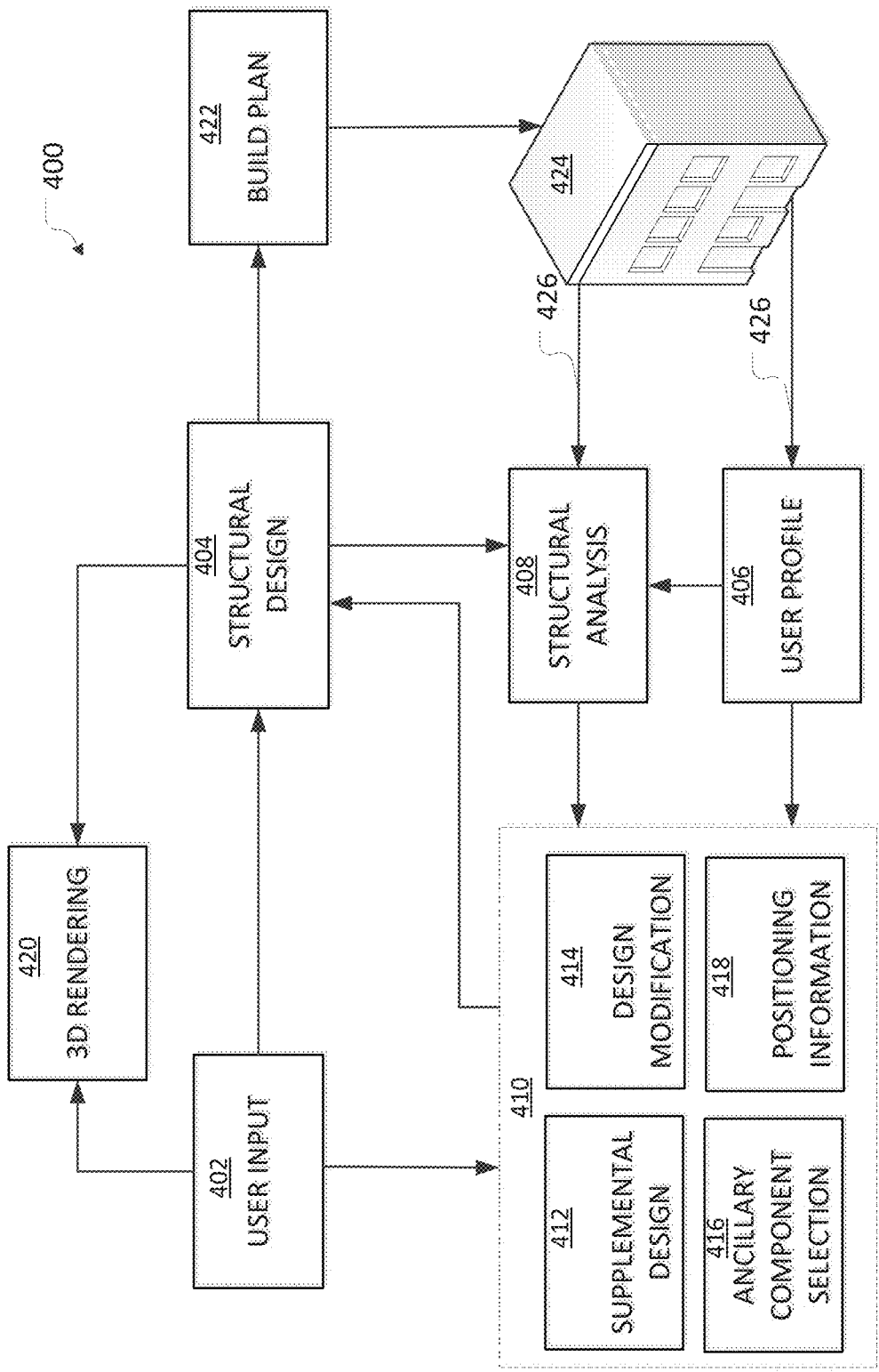
FIG. 4 is an exemplary data flow associated with the 3D construction assistance module, according to an aspect of the present disclosure.

FIG. 4 provides an exemplary data flow 400 for the assistance module 200. This data flow may include a user input 402, a structural design 404, a user profile 406, a structural analysis 408, a design option 410, including a supplemental design 412, a design modification 414, an ancillary component selection 416, or positioning information 418, a 3D rendering 420, a build plan 422, a building 424, or a building update 426. As the different data may be adjusted or based on other data, the data flow 400 may be iterative. While the arrows illustrating the flow of data are unidirectional, in an aspect, the data may be bidirectional. In discussing the data flow 400, reference will be made to the exemplary user interface 300 of FIG. 3 and the exemplary GUI 500 of FIG. 5.

A user input 402 may indicate a structural design 404 chosen by the second user 104. As discussed above, the structural design 404 may be a design file for a component or a structure. As an example, the user input 402 may be via the selecting module 210. The structural design 404 may have been created or submitted though the design module 202. For example, the second user 104 may use the control element 306 to select the design.

The second user 104 may also be associated with a user profile 406. The second user 104 may review or update the user profile 406 at a link 502. The user profile 406 may include information related to the second user 104, including whether the second user 104 is a designer, customer, or dealer. The user profile 406 may include a building history for each of the designs purchased by the second user 104. The user profile 406 may indicate a location in which the second user 104 plans to place structures. For example, the second user 104 may be building a subdivision, and the user profile 406 may include an indication of the geographic location of the subdivision. For example, the user interface 500 may include a map 504 indicating the location of future or existing buildings associated with the second user 104. The user profile 406 may include a location for the specific structure. The location information from the user profile is populated at text box 504 The user profile 406 may include an inventory of materials, ancillary components, additive manufacturing machines, tools, or the like. The user profile 406 may include the location(s) of the inventory. The user profile 406 may include previous orders, including order information for materials, ancillary components, additive manufacturing machines, tools, or the like. The user profile 406 may include repair history, such as a history of repairs of additive manufacturing machines. The user profile 406 may include records, including permits, licenses, deed information, or the like associated with the second user 104. The user profile 406 may include rental or manpower suppliers the second user 104 has saved or done business with, such as additive manufacturing machine renters or contract operators. The user profile 406 may include data archived by the second user 104 through the assistance module, including favorite designers, archived designs, annotated designs, or other lists of preferences, like preferences related to ancillary components, materials, suppliers, or the like. The user profile 406 may also indicate sale history of structures, including the chain of title for a building or the contact information for the current buyer.

The structural analysis 408 may depend on the structural design 404 or the user profile 406. In an aspect, the structural analysis 408 is the structural analysis performed by the analytics engine 206 when the structural design is accepted from the design module 202. In another aspect, the structural analysis 408 is an updated version of the previous structural analysis of the original design. The structural analysis 408 may be based on any modifications to the structural design 404 made by the second user 104. The structural analysis 408 may be based on the user profile 406. The structural analysis 408 may depend on any changes to the structural design made by the second user 104, such as through user interface 500. The second user 104 may review the structural analysis 408 during the selection process through the control 508.

Based on the structural analysis 408 or the user profile 406, the design option 410 may be developed. The design option 410 may include any way of implementing or changing the design. The design option 410 may be provided to the second user 104 through the GUI 500 by the display 510.

For example, the design option 410 may include a supplemental design 412. The supplemental design 412 may include an additional feature or element that can be incorporated into or added to the structural design. The different options for the supplemental design 412 may be based on the structural analysis 408 or the user profile 406. The supplemental design 412 may include an addition to the structure, such as a garage, porch, deck, extension, or the like. The supplemental design 412 may include an additional component, such as siding, solar panels, gutters, a water line connection, gas line connection, shutters, countertops, or the like. The supplemental design 412 may include available supplemental designs that will not drop the structural analysis below a predefined level. The supplemental design 412 may include designs based on the preferences of the second user 104, as indicated by the user profile 406. The supplemental design 412 may include a recommended supplemental design. The supplemental design 412 may be provided to the second user 104 through the GUI 500 by the control 512.

The design option 410 may include the design modification 414. Any adjustment to the structural design 404, including resizing, replacing, removing, inserting, or modifying, or the like, may be a design modification 414. For example, the design modification 414 may include removing or adding a wall, or changing the thickness of the material. The design modification 414 may include extending the dimensions of all or a portion of the structure. The design modification 414 may include replacing doorways with French doorways. The design modification 414 may include available modifications that will not drop the structural analysis below a predefined level. The design modification 414 may include modifications based on the preferences of the second user 104, as indicated by the user profile 406. The design modification 414 may include a recommended modification. The design modification 414 may be provided to the second user 104 through the GUI 500 by the control 514.

The design option 410 may include an ancillary component selection 416. An ancillary component may be a part or other component other than the material extruded by the additive manufacturing machine that may be used to build the structure. Ancillary components may include screws, nails, structural supports, doorframes window lintels, fasteners, drywall, or the like. The ancillary component selection 416 may provide a list of available ancillary components, suppliers, or the like. The ancillary component selection 416 may recommend a particular supplier or brand of an ancillary component. The ancillary component selection 416 may be provided to the second user 104 through the GUI 500 by the control 516.

The design option 410 may include positioning information 418. For example, within a geographic location of the planned build site, the positioning information 418 may be chosen to maximize sunlight. In an aspect, the structural analysis 408 includes shadow analysis, and the positioning information 418 may be based on the shadow analysis. The positioning information may similarly include an orientation of the planned building. The positioning information may be based on one or more of the terrain, the climate, flood zones, shadow analysis, or other structural analysis 408. The positioning information 418 may include multiple options for positioning or orienting the structure. The positioning information 418 may be provided to the second user 104 through the user interface 500 by the control 518.

The user input 402 may select one or more of the design options 410. The selected design option 410 will affect the structural design 404. The user input 402 may select the design option 410 using any known user input method, including a touch screen, radio button, checkbox, button, a mouse curser, or the like, such as the controls 512, 514, 516, or 518.

The structural design 404 may form the basis for the 3D rendering 420. The 3D rendering 420 will be a rendering of the structure. The 3D rendering 420 may be displayed in window 520. Through window 520, the user input 402 may interact with or change the 3D rendering 420, such as zooming, changing the view, rotating, or otherwise manipulating the 3D rendering 420, for example using one or more view controls 521.

The structural design 404 may also form the bases of the build plan 422. The second user 104 may customize the contents of the build plain 422 through controls 522. The build plan 422 may include or be associated with a format of the structural design 404 that can be processed by an additive manufacturing machine to construct at least a portion of the structure. The build plan 422 may be indicative of positioning of the planned structure, including the geographic location, a specific location within a geographic area, or an orientation of the structure. The build plan may identify a machine part, tool, or additive manufacturing machine for building the structure. The build plan 422 may include a material list, an ancillary component list, or a builder list. The material or ancillary component list may identify sources of the materials or components, such as ordering information, or it may include an order form for already-purchased materials/components. The builder list may include a list of available personnel to build the structure, including manufacturers, operators, inspectors, civil engineers, or the like.

The build plan 422 may be used to build the physical structure based on the structural design 404. The layout, materials, components, and or suppliers for building the building 424 may be indicated by the build plan 422.

As reflected in FIG. 4, there is a feedback loop in the data flow 400. Data related to the building 424 may be incorporated into the structural analysis 408. For example, building updates 426—indicating a change or status of the building 424—may be compiled into a building history. The building history may be incorporated into the user profile 406. Additionally or alternatively, the building history of the building 424 may be incorporated into the structural analysis 408 of future comparable structures. For example, the next time the second user 104 builds a building based on the structural design 404, the structural analysis 408 and the design option 410 may be different than when the building 424 was built. This data feedback may provide more accuracy or precision to the structural analysis 408. In turn, the design option 410 for future builds may seek to remedy a defect or weakness in the building 424. For example, if the building 424 was built with a grade A roof that needed to be replaced before the expected lifetime of the roof was up, the design option 410 may recommend a different grade roof.

The computer-based system 600 includes at least one processor, such as a processor 602. The processor 602 may be connected to a communication infrastructure 604, for example, a communications bus, a cross-over bar, a network, or the like. Various software aspects are described in terms of this example computer-based system 600. Upon perusal of the present description, it will become apparent to a person skilled in the relevant art(s) how to implement the present disclosure using other computer systems or architectures.

The computer-based system 600 includes a display interface 606 that forwards graphics, text, or other data from the communication infrastructure 604 or from a frame buffer (not shown) for display on a display unit 608.

The computer-based system 600 further includes a main memory 610, such as random access memory (RAM), and may also include a secondary memory 612. The secondary memory 612 may further include, for example, a hard disk drive 614 or a removable storage drive 616, representing a floppy disk drive, a magnetic tape drive, an optical disk drive, etc. The removable storage drive 616 reads from or writes to a removable storage unit 618 in a well-known manner. The removable storage unit 618 may represent a floppy disk, magnetic tape, or an optical disk, and may be read by and written to by the removable storage drive 616. As will be appreciated, the removable storage unit 618 includes a computer usable storage medium having computer software or data stored therein.

In accordance with various aspects of the present disclosure, the secondary memory 612 may include other similar devices for allowing computer programs or other instructions to be loaded into the computer-based system 600. Such devices may include, for example, a removable storage unit 620, and an interface 622. Examples of such may include a program cartridge and cartridge interface (such as that found in video game devices), a removable memory chip (such as an erasable programmable read only memory (EPROM), or programmable read only memory (PROM)) and associated socket, and other removable storage units and interfaces, which allow software and data to be transferred from the removable storage unit 620 to the computer-based system 600.

The computer-based system 600 may further include a communication interface 624. The communication interface 624 may allow software or data to be transferred between the computer-based system 600 and external devices. Examples of the communication interface 624 include, but may not be limited to a modem, a network interface (such as an Ethernet card), a communications port, a Personal Computer Memory Card International Association (PCMCIA) slot and card, or the like. Software or data transferred via the communication interface 624 may be in the form of a number of signals, hereinafter referred to as signals 626, which may be electronic, electromagnetic, optical or other signals capable of being received by the communication interface 624. The signals 626 may be provided to the communication interface 624 via a communication path (e.g., channel) 628. The communication path 628 carries the signals 626 and may be implemented using wire or cable, fiber optics, a telephone line, a cellular link, a radio frequency (RF) link, or other communication channels.

In this document, the terms "computer program medium" and "computer usable medium" are used to generally refer to media such as the removable storage drive 616, a hard disk installed in the hard disk drive 614, or the like. These computer program products provide software to the computer-based system 600. The present disclosure is directed to such computer program products.

Computer programs (also referred to as computer control logic) may be stored in the main memory 610 or the secondary memory 612. The computer programs may also be received via the communication interface 604. Such computer programs, when executed, enable the computer-based system 600 to perform the functions consistent with the present disclosure, as discussed herein. In particular, the computer programs, when executed, enable the processor 602 to perform the features of the present disclosure. Accordingly, such computer programs represent controllers of the computer-based system 600.

In accordance with an aspect of the present disclosure, where the disclosure is implemented using a software, the software may be stored in a computer program product and loaded into the computer-based system 600 using the removable storage drive 616, the hard disk drive 614, or the communication interface 624. The control logic (software), when executed by the processor 602, causes the processor 602 to perform the functions of the present disclosure as described herein.

In another aspect, the present disclosure is implemented primarily in hardware using, for example, hardware components, such as application specific integrated circuits (ASIC). Implementation of the hardware state machine to perform the functions described herein will be apparent to persons skilled in the relevant art(s). In yet another aspect, the present disclosure is implemented using a combination of both the hardware and the software.

Various aspects disclosed herein are to be taken in the illustrative and explanatory sense, and should in no way be construed as limiting of the present disclosure. All numerical terms, such as, but not limited to, "first" and "second" or any other ordinary or numerical terms, should also be taken only as identifiers, to assist the reader's understanding of the various aspects, variations, components, or modifications of the present disclosure, and may not create any limitations, particularly as to the order, or preference, of any aspect, variation, component or modification relative to, or over, another aspect, variation, component or modification.

It is to be understood that individual features shown or described for one aspect may be combined with individual features shown or described for another aspect. The above described implementation does not in any way limit the scope of the present disclosure. Therefore, it is to be understood although some features are shown or described to illustrate the use of the present disclosure in the context of functional segments, such features may be omitted from the scope of the present disclosure without departing from the spirit of the present disclosure as defined in the appended claims.

INDUSTRIAL APPLICABILITY

The disclosed systems and methods provide a robust system for crowd-sourcing designs and data related to the designs. While crowd-sourcing provides numerous advantages, with many different designers, it may be difficult for other users to determine a quality of a design. The disclosed systems and methods provide a universal platform by which these designs may be provided to customers for review and purchase.

Figure 7:
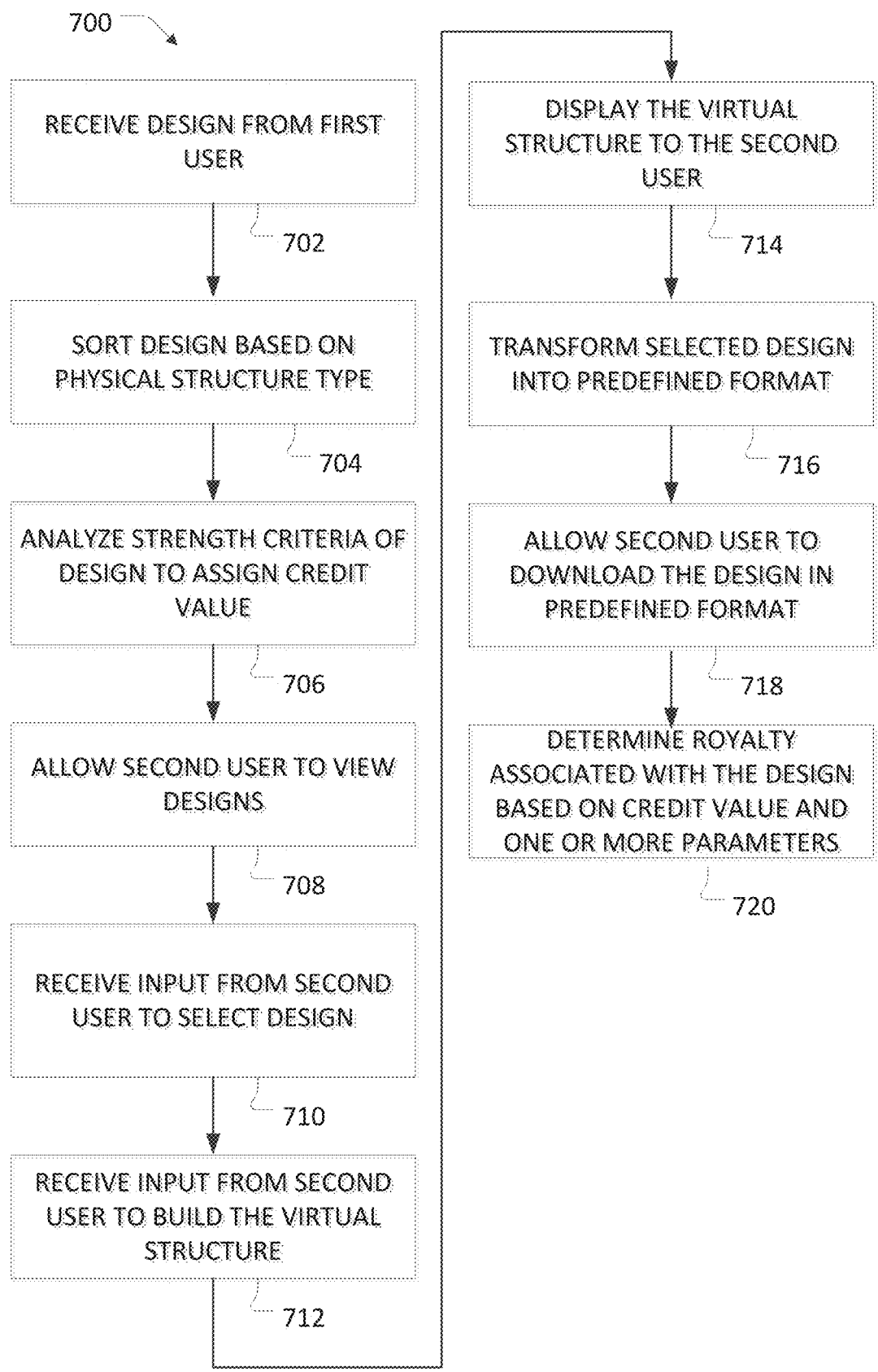
FIG. 7 illustrates an exemplary flowchart for a method according to an aspect of the present disclosure.

FIG. 7 illustrates a flowchart for a method 700 for enabling users to select one or more designs for 3D construction of the physical structure, according to an aspect of the present disclosure. In an aspect, one or more steps of the method 700 may be implemented using the environment 100 described above. It should be noted that although FIG. 7 shows a specific order of the steps, it is understood that the order of these steps may differ from what is depicted. Also two or more steps may be performed concurrently or with partial concurrence. Further, it should be noted that some steps are optional and may be omitted. It is understood that all such variations are within the scope of this disclosure.

Step 702 may include receiving the one or more designs from the first users 102. In one aspect, step 702 may include receiving a design file uploaded by the first user 102. In another aspect, the first user 102 may use the assistance module 200 to create or modify a design. As an example, the first user 102 may upload a design for a silo.

Step 704 may include sorting each of the designs into a category. The structural design may be categorized based on at least a structure type, such as a building type or a component type. The structural design may be categorized into multiple categories, including subcategories. For example, the silo may be categorized into one or more of the following categories: building, silo, or storage facility.

Step 706 may include analyzing the strength criteria for each of the designs to assign the credit value to each of the designs. The analysis may include an initial analysis to determine whether the design passes associated strength criteria. The analysis may be based on one or more criteria, such as criteria specific to the one or more categories associated with the design. The credit value may be based on strength criteria, aesthetics, materials, cost, design popularity, amount of material used for constructing the corresponding physical structure, time for extruding the material, or any other feature of the design. The credit value may be based on feedback received from implementation of the design or from third parties. For example, the silo may be assigned a credit value based on the volume or weight of storage the silo can hold, the expected lifespan of the silo, and the popularity of the design compared to other silo designs.

Step 708 may include allowing the second user 104 to view each of the designs, the associated category, and the credit value. The second user 104 may search through and evaluate the designs based on the design, the structural analysis, the credit value, or the category to which the design is assigned. The second user 104 may view details related to the design, such as materials, dimensions, costs, components, tools, or the like. In an example, step 708 may provide search results including the silo design based upon a query for grain storage structures.

Step 710 receiving an input from the second user 104 to select at least one design. For example, the second user 104 may select the silo design after comparing the structural criteria of the silo design to other designs. Step 710 may include the second user 104 selecting different portions of different designs. For example, the second user 104 may select the silo design but modify the roof of the silo based on a second silo design.

Step 712 may include receiving an input from the second user 104 to render the virtual structure using the selected designs. The assistance module 200 may be associated with suitable visualization software that may allow the second user 104 to view a three-dimensional representation of the structural design. This may include rendering a representation of a design comprising different components of multiple designs, or including additional features. For example, step 712 may include rendering solar panels on the silo.

Step 714 may include displaying the virtual structure to the second user 104. The assistance module 200 may display the virtual structure on an associated display screen. This display may constitute a three-dimensional representation of the design. The second user 104 may interact with the three-dimensional image, such as by zooming, panning, tilting, rotating, or otherwise manipulating the view of the design.

Step 716 may include transforming the selected designs into a predefined format. The selected design may be formatted such that it may be used by an additive manufacturing machine to extrude or manufacture at least a portion of the structure in a layer-by-layer format. The predefined format enables the processing of the selected designs into the physical structure through the 3D construction process. In an aspect, the predefined format may have a file extension that may be accessed by a predetermined type of 3D construction machine. In an example, the design files in the predefined format may be only accessed by the 3D construction machines of an XYZ company. The additive manufacturing machine-readable format may be associated with the three-dimensional representation of the design rendered in step 714.

Step 718 may include allowing the second user 104 to download the selected designs in the predefined format. For example, the second user 104 may purchase or license the selected design. The downloaded format may be provided to the additive manufacturing machine for actual building of a structure based on the structural design. Step 718 may require that the second user 104 pay a royalty or fee to download the formatted design.

Step 720 may include determining a royalty associated with the selected designs based at least in part on the credit value or another parameter. This may include associating any collected royalties with the design from which the royalties were originated. This may further include transferring payment to the designer of the designs.

With such an implementation of the method 700, various first users 102, such as, for example, designers, structural engineers, or any other users may build designs or upload their designs for purchase to a large number of audience. Further, the present disclosure also enables performing structural analysis of these designs so as to determine if the designs have a sufficient structural integrity to build the physical structure.

Further, the present disclosure also provides the interface for the second users 104, such as, for example, customers, dealers, builders, construction companies, or the like to view and select one or more of these designs. Additionally, method 700 may enable the second user 104 to modify and view the virtual structure using the designs in various views such as, 3D, perspective and the like. Further, the designs may be converted into a format that can be readily uploaded to the 3D construction machine to further build the physical structure.

The present disclosure may facilitate determining royalty for the designs based on the usage of these designs by the second users 104 and other parameters. Accordingly, the payment to be paid to the first users 102 may also be decided.

Figure 8:
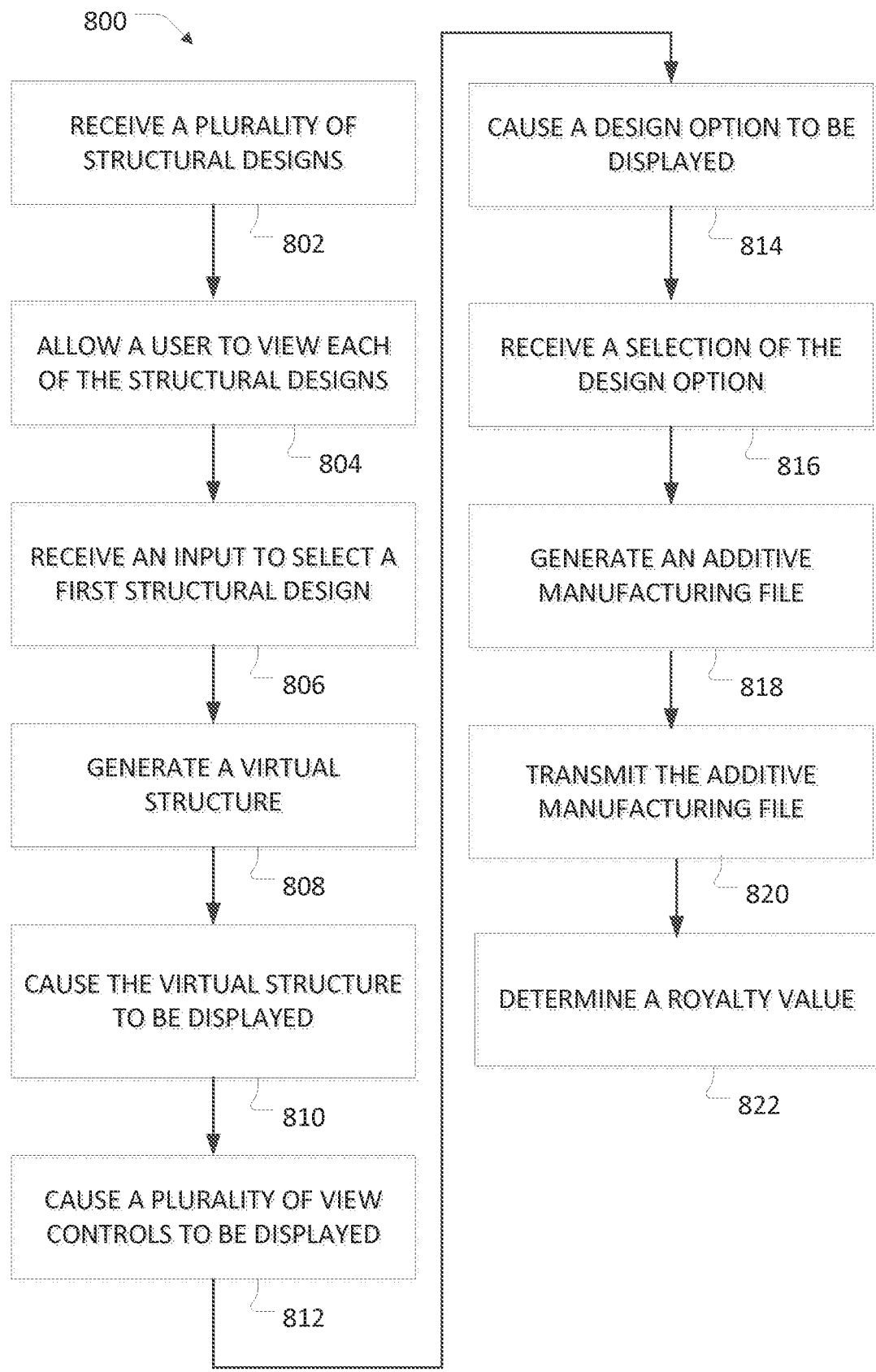
FIG. 8 illustrates an exemplary flowchart for a method according to an aspect of the present disclosure.

FIG. 8 illustrates an exemplary method 900. In an aspect, one or more steps of the method 800 may be implemented using the environment 100 described above. It should be noted that although FIG. 8 shows a specific order of the steps, it is understood that the order of these steps may differ from what is depicted. Also two or more steps may be performed concurrently or with partial concurrence. Further, it should be noted that some steps are optional and may be omitted. It is understood that all such variations are within the scope of this disclosure.

Step 802 may include receiving or accessing a plurality of structural designs (e.g., structural design 404) via a computer-based system such as the assistance module 200 and/or environment 100. In an aspect, each of the structural designs has a source identifier associated therewith. As an example, the source identifier is associated with one or more contributing designers to the creation of the structural design. In an aspect, each of the structural designs has a structural value associated therewith. As an example, the structural value represents at least one of a strength criterion, a cost criterion, an aesthetic criterion, or a material grade. Other metrics or criterion may be represented by the structural value. Each of the plurality of structural designs may have a respective category associated therewith such as a part or a component of the physical structure. For example a component category may encompass a roof, wall, ceiling, column, support beam, staircase, chimney, building expansion, such as an add-on porch, or any other portion of a building or structure. These components may be grouped generally as a component type. Additionally or alternatively, components may be categorized based on at least more specific categories, such as categories devoted to a specific type of component (e.g., roof).

Step 804 may include allowing a user to view each of the plurality of structural designs, such as illustrated in FIG. 3, for example. In an aspect, each of the plurality of structural designs may be provided in a list format and may be sorted based at least on the respective category of the structural design. Other forms of viewing may be used such as thumbnails, three-dimensional images, two-dimensional images, text description, and the like.

Step 806 may include receiving, via the computer based system, an input from the user to select a first structural design from the plurality of structural designs. In an aspect, the structural value of the first structural design may be updated based on at least a popularity of the first structural design. As an example, the popularity may be based at least on a number of user selections of the first structural design.

Step 808 may include generating a virtual structure using at least the selected first structural design. In an aspect, the virtual structure may be an interactive three-dimensional representation of at least the structural design. Other components and designs may be included with the virtual structure to illustrate a complete structure or group of structures.

Figure 5:
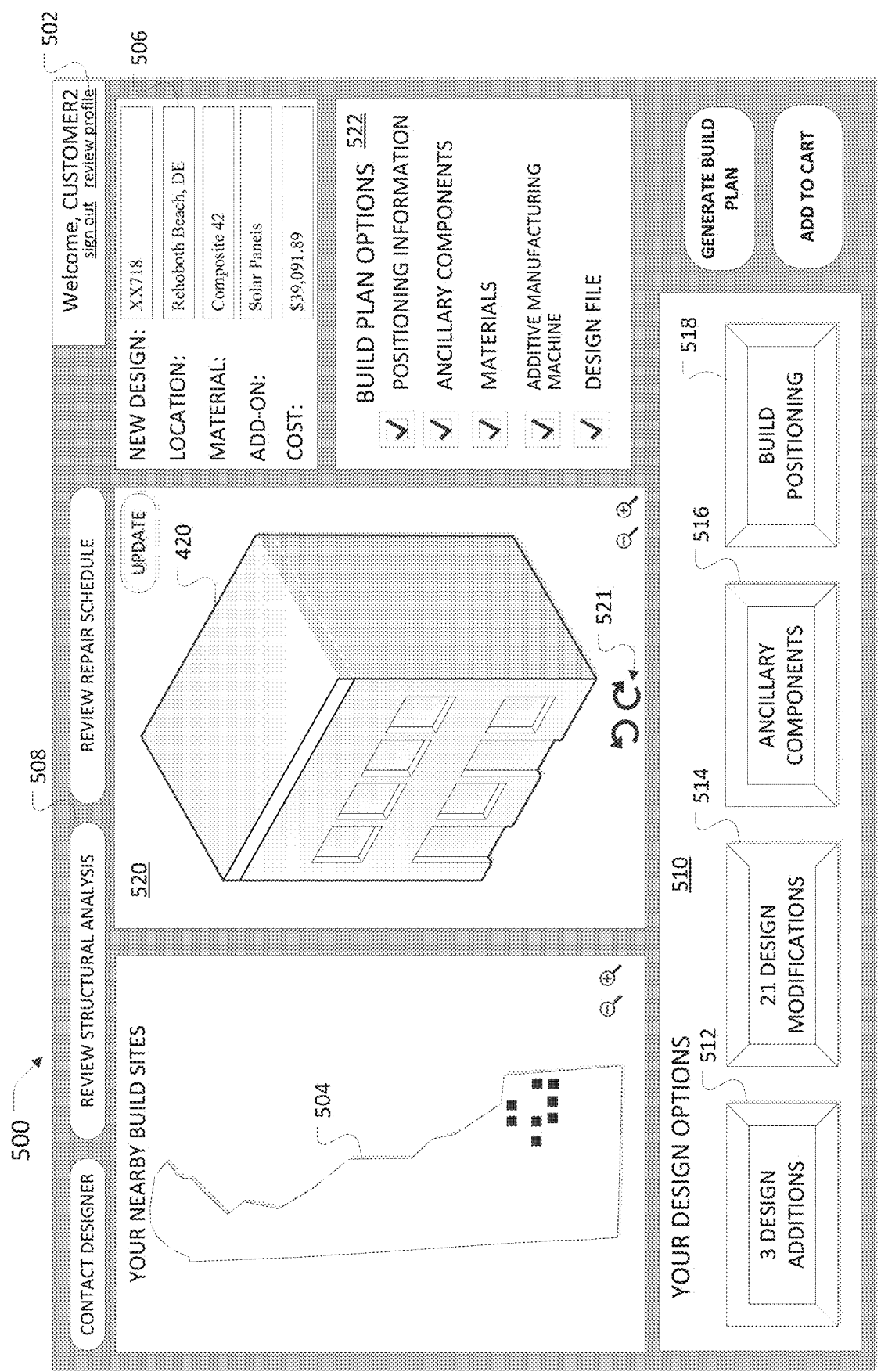
FIG. 5 is an exemplary user interface associated with the 3D construction assistance module, according to an aspect of the present disclosure.
Figure 6:
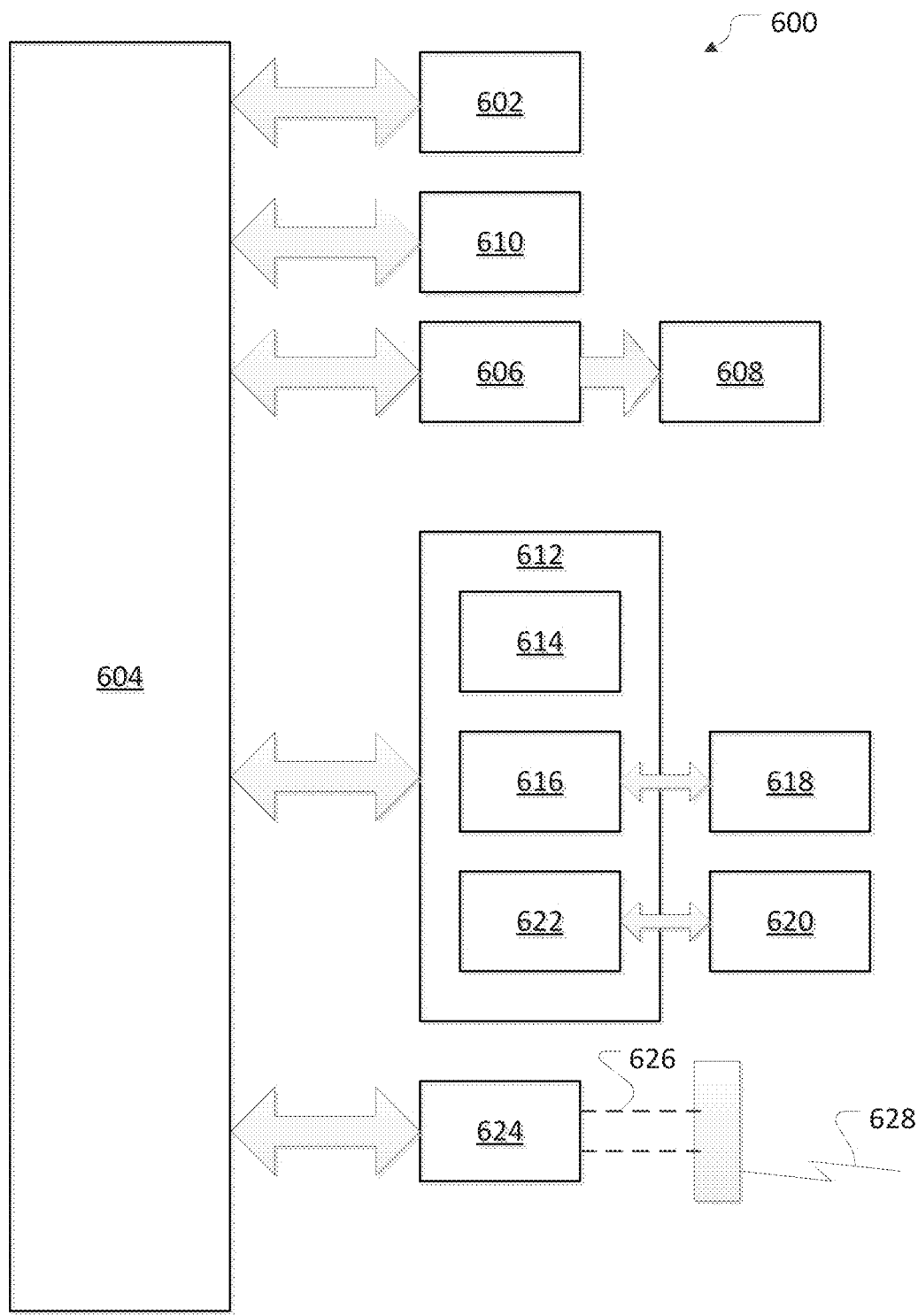
FIG. 6 is a block diagram of an exemplary computer system, according to an aspect of the present disclosure.

Step 810 may include causing the virtual structure to be displayed to the user, such as illustrated in FIG. 5, for example. As such, as user may interact with the displayed virtual structure and may engage viewing options to control a view of the virtual structure.

Step 812 may include causing a plurality of viewing controls to be displayed to the user. In an aspect, each of the plurality of viewing controls is configured to manipulate a view of the virtual structure such as a pan, tilt, zoom, slice/section, and the like.

Step 814 may include causing a design option to be displayed to a user. The design option may be a recommendation or option related to the particular planned build of the first structural design. For example, the design option may relate to the positioning information of the building. As another example, the design option may relate to a design modification. As another example, the design option may relate to a design addition. The design option may relate to ancillary components. For example, the design option may include an ancillary component selection. This may include information related to what ancillary components are called for by the design, options for obtaining these components, or the like. The design option may enable a user to purchase or otherwise order the ancillary components, for example through the selecting module 210. The design option may indicate that the projected repair schedule may be impacted based on incorporation of a particular ancillary component. The design option may relate to hardcopy papers such as blueprints or formal drawings prepared for submission to a local authority for building approval. Step 816 may include receiving a selection of the design option.

Step 818 may include generating an additive manufacturing file indicative of the first structural design in a predefined format. In an aspect, the predefined format enables the processing of the additive manufacturing file into a physical structure through an additive manufacturing process. As an example, the additive manufacturing file may configured to be processed by an additive manufacturing machine to construct at least a portion of a structure based on at least the first structural design in a layer-by-layer manner.

Step 820 may include transmitting the selected first structural design in the predefined format. As an example, the transmitting the selected first structural design in the predefined format may include downloading the selected first structural design to a portable storage medium. As a further example, the transmitting the selected first structural design in the predefined format may include transmitting the selected first structural design to an additive manufacturing machine. Other transmission methods and/or destinations may be used such as a local download, to a designated builder, and/or another designated destination. In certain aspects, the cost of transmitting the selected first structural design in the predefined format may be dependent upon at least the manner of transmission, the destination of the transmission, and/or the number of transmissions requested.

Step 822 may include determining, by the computer based system, a royalty value associated with the first structural design based at least in part on the structural value associated with the first structural design, the source identifier, and the design option. In an aspect, the royalty associated with a particular structural design may be modified based on the selection and purchase of one or more design options. As an example, a first royalty value may be associated with the download of the structural design and a second royalty value may be associated with the download of the structural design along with a contemporaneous or subsequent purchase of ancillary components such as windows, doors, and the like. A source of the ancillary components may contribute to the royalty value as an incentive for certain design options. As a further example, the design option may include hardcopy printing of blueprints or formal prints required for submission to local building authorities. As such, the purchase of a design option may cost more for the buyer and thus may result in a higher royalty value.

Figure 9:
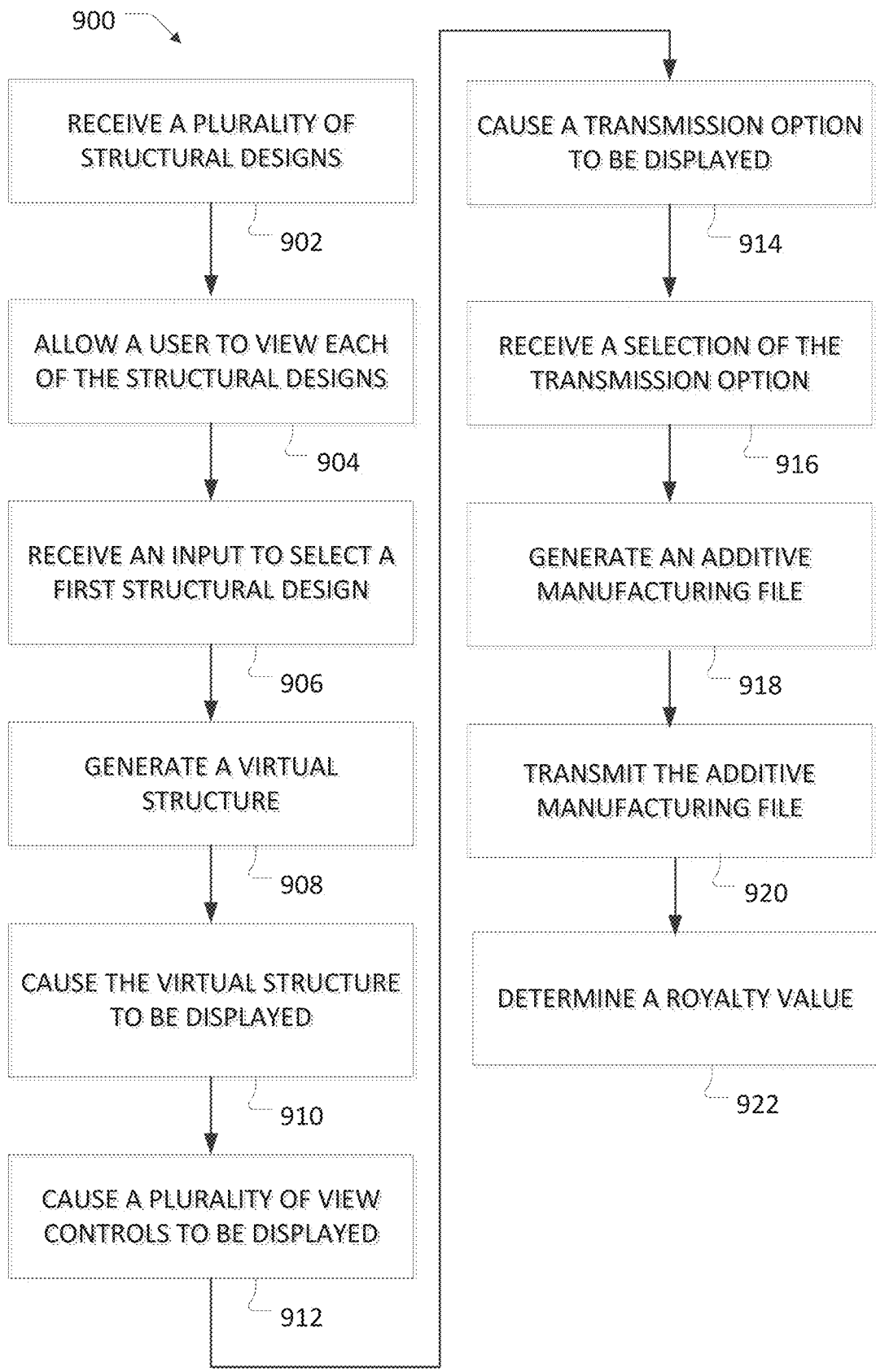
FIG. 9 illustrates an exemplary flowchart for a method according to an aspect of the present disclosure.

FIG. 9 illustrates a flowchart for an exemplary method 900. In an aspect, one or more steps of the method 900 may be implemented using the environment 100 described above. It should be noted that although FIG. 9 shows a specific order of the steps, it is understood that the order of these steps may differ from what is depicted. Also two or more steps may be performed concurrently or with partial concurrence. Further, it should be noted that some steps are optional and may be omitted. It is understood that all such variations are within the scope of this disclosure.

Step 902 may include receiving or accessing a plurality of structural designs (e.g., structural design 404) via a computer-based system such as the assistance module 200 and/or environment 100. In an aspect, each of the structural designs has a source identifier associated therewith. As an example, the source identifier is associated with one or more contributing designers to the creation of the structural design. In an aspect, each of the structural designs has a structural value associated therewith. As an example, the structural value represents at least one of a strength criterion, a cost criterion, an aesthetic criterion, or a material grade. Other metrics or criterion may be represented by the structural value. Each of the plurality of structural designs may have a respective category associated therewith such as a part or a component of the physical structure. For example a component category may encompass a roof, wall, ceiling, column, support beam, staircase, chimney, building expansion, such as an add-on porch, or any other portion of a building or structure. These components may be grouped generally as a component type. Additionally or alternatively, components may be categorized based on at least more specific categories, such as categories devoted to a specific type of component (e.g., roof).

Step 904 may include allowing a user to view each of the plurality of structural designs, such as illustrated in FIG. 3, for example. In an aspect, each of the plurality of structural designs may be provided in a list format and may be sorted based at least on the respective category of the structural design. Other forms of viewing may be used such as thumbnails, three-dimensional images, two-dimensional images, text description, and the like.

Step 906 may include receiving, via the computer based system, an input from the user to select a first structural design from the plurality of structural designs. In an aspect, the structural value of the first structural design may be updated based on at least a popularity of the first structural design. As an example, the popularity may be based at least on a number of user selections of the first structural design.

Step 908 may include generating a virtual structure using at least the selected first structural design. In an aspect, the virtual structure may be an interactive three-dimensional representation of at least the structural design. Other components and designs may be included with the virtual structure to illustrate a complete structure or group of structures.

Step 910 may include causing the virtual structure to be displayed to the user, such as illustrated in FIG. 5, for example. As such, as user may interact with the displayed virtual structure and may engage viewing options to control a view of the virtual structure.

Step 912 may include causing a plurality of viewing controls to be displayed to the user. In an aspect, each of the plurality of viewing controls is configured to manipulate a view of the virtual structure such as a pan, tilt, zoom, slice/section, and the like.

Step 914 may include causing a transmission option to be displayed to the user. In an aspect, the transmission options may include local download, transmission to a designated builder, and/or transmission to another designated destination. Step 916 may include receiving a selection of the transmission option.

Step 918 may include generating an additive manufacturing file indicative of the first structural design in a predefined format. In an aspect, the predefined format enables the processing of the additive manufacturing file into a physical structure through an additive manufacturing process. As an example, the additive manufacturing file may configured to be processed by an additive manufacturing machine to construct at least a portion of a structure based on at least the first structural design in a layer-by-layer manner.

Step 920 may include transmitting the selected first structural design in the predefined format. As an example, the transmitting the selected first structural design in the predefined format may include downloading the selected first structural design to a portable storage medium. As a further example, the transmitting the selected first structural design in the predefined format may include transmitting the selected first structural design to an additive manufacturing machine. Other transmission methods and/or destinations may be used such as a local download, to a designated builder, and/or another designated destination. In certain aspects, the cost of transmitting the selected first structural design in the predefined format may be dependent upon at least the manner of transmission, the destination of the transmission, and/or the number of transmissions requested.

Step 922 may include determining, by the computer based system, a royalty value associated with the first structural design based at least in part on the structural value associated with the first structural design, the source identifier, and the selected transmission option.

The present disclosure is described herein with reference to system architecture, block diagrams, flowchart illustrations of methods, and computer program products according to various aspects of the disclosure. It will be understood that each functional block of the block diagrams and the flowchart illustrations, and combinations of functional blocks in the block diagrams and flowchart illustrations, respectively, can be implemented by computer program instructions.

These computer program instructions may be loaded onto a general-purpose computer, special-purpose computer, or other programmable data processing apparatus to produce a machine, such that the instructions that execute on the computer or other programmable data processing apparatus create means for implementing the functions specified in the flowchart block or blocks. These computer program instructions may also be stored in a computer-readable memory that can direct a computer or other programmable data processing apparatus to function in a particular manner, such that the instructions stored in the computer-readable memory produce an article of manufacture including instruction means which implement the function specified in the flowchart block or blocks. The computer program instructions may also be loaded onto a computer or other programmable data processing apparatus to cause a series of operational steps to be performed on the computer or other programmable apparatus to produce a computer-implemented process such that the instructions which execute on the computer or other programmable apparatus provide steps for implementing the functions specified in the flowchart block or blocks.

Accordingly, functional blocks of the block diagrams and flow diagram illustrations support combinations of means for performing the specified functions, combinations of steps for performing the specified functions, and program instruction means for performing the specified functions. It will also be understood that each functional block of the block diagrams and flowchart illustrations, and combinations of functional blocks in the block diagrams and flowchart illustrations, can be implemented by either special purpose hardware-based computer systems which perform the specified functions or steps, or suitable combinations of special purpose hardware and computer instructions. Further, illustrations of the process flows and the descriptions thereof may make reference to user windows, web pages, websites, web forms, prompts, etc. Practitioners will appreciate that the illustrated steps described herein may comprise in any number of configurations including the use of windows, web pages, hypertexts, hyperlinks, web forms, popup windows, prompts, and the like. It should be further appreciated that the multiple steps as illustrated and described may be combined into single web pages and/or windows but have been expanded for the sake of simplicity. In other cases, steps illustrated and described as single process steps may be separated into multiple web pages and/or windows but have been combined for simplicity.

Terminology

A "first user," as used herein, may include one or more individuals, a business, an entity, a group, a software and/or a hardware that desires to utilize the disclosure to build one or more designs for a physical structure and/or provide designs for purchase. For example, the first user may be a design engineer that may intend to either design one or more structures and/or provide the designs for purchase to customers.

A "second user," as used herein, may include any individual, business, entity, group, dealer, software and/or hardware that desires to utilize the disclosure to select one or more designs provided for purchase from the first user. In an example, the second user may be a construction company that may intend to use the designs of the first user in 3D construction.

A "physical structure," as used herein, may include any structures or parts of the structures such as, a house, a building that may be constructed using any additive manufacturing methods such as 3D printing using machines for example, a 3D excavator.

An "interface," as used herein, may include any environment that may allow the first user and the second user to upload and download the designs respectively. In an example, the interface may include an application hosted on a web platform. In such a case, the first user and the second user may download the application. The interface may allow the corresponding first user and the second user to provide necessary inputs to accordingly execute one or more functions discussed herein.

The systems, methods and computer program products disclosed in conjunction with various aspects of the present disclosure are embodied in a systems and methods for providing an interface enabling users to select one or more designs to be used in the 3D construction of the physical structure.

While aspects of the present disclosure have been particularly shown and described with reference to the aspects above, it will be understood by those skilled in the art that various additional aspects may be contemplated by the modification of the disclosed machines, systems and methods without departing from the spirit and scope of what is disclosed. Such aspects should be understood to fall within the scope of the present disclosure as determined based upon the claims and any equivalents thereof.

I claim:

1. A computer-implemented method comprising:
receiving a plurality of design files at a computer-based system, corresponding to a network portal, wherein each of the design files is indicative of a respective structural design, a structural value associated with the respective structural design, and a source identifier associated with a designer of the respective structural design;
accessing the network portal and causing a graphical representation of at least a portion of the structural designs to be displayed to a user via a graphical user interface;
receiving a user selection of a first structural design of the displayed structural designs;
displaying, via the graphical user interface, an interactive model of the first structural design;
transforming the first structural design of the displayed structural designs into an additive manufacturing file indicative of the first structural design in a predefined format, wherein the predefined format enables processing of the additive manufacturing file into a physical structure through an additive manufacturing process;
transmitting the additive manufacturing file indicative of the first structural design in the predefined format, wherein the additive manufacturing file indicative of the first structural design in the predefined format further comprises instructions to enable a three-dimensional printer to deposit material via the three-dimensional printer in a layer-by-layer manner and to build a structure according to the additive manufacturing file in the predefined format; and
determining, by the computer based system, a royalty value associated with the selected first structural design based at least on the structural value, the source identifier, and one or more additional parameters.

2. The method of claim 1, wherein the three-dimensional printer is configured to perform an extrusion process.

3. The method of claim 1, wherein the one or more additional parameters comprises one or more of a number of transmission of the selected first structural design, a type of transmission of the selected first structural design, or a recipient device intended to receive the selected first structural design.

4. The method of claim 1, wherein the structural value represents at least one of a strength criterion, a cost to build criterion, an aesthetic criterion, or a material grade.

5. The method of claim 1, further comprising updating the structural value of the first structural design based on at least a popularity of the first structural design, wherein the popularity is based at least on a number of user selections of the first structural design.

6. The method of claim 1, wherein the transmitting the additive manufacturing file in the predefined format comprises downloading the additive manufacturing file to a portable storage medium.

7. The method of claim 1, further comprising causing a plurality of transmission options to be displayed to the user and receiving a selection of at least one of the plurality of transmission options, wherein the transmitting the additive manufacturing file in the predefined format is based on the selection of the at least one of the plurality of transmission options, and wherein the royalty value is variable based at least on the plurality of transmission options.

8. A computer-implemented method comprising:
receiving a plurality of design files at a computer-based system, corresponding to a network portal, wherein each of the design files is indicative of a respective structural design, a structural value associated with the respective structural design, and a source identifier associated with a designer of the respective structural design;

accessing the network portal and causing a graphical representation of at least a portion of the structural designs to be displayed to a first user;

receiving a first user selection of a first structural design of the displayed structural designs;

modifying, by a second user, the first structural design in response to receiving the first user selection of the first structural design, wherein the second user is different than the first user;

generating an additive manufacturing file indicative of the modified first structural design in a predefined format, wherein the predefined format enables processing of the additive manufacturing file into a physical structure through an additive manufacturing process;

transmitting the additive manufacturing file in the predefined format, wherein the additive manufacturing file in the predefined format comprises instructions to enable a three-dimensional printer to deposit material via the three-dimensional printer in a layer-by-layer manner and to build a structure according to the additive manufacturing file in the predefined format; and determining, by the computer based system, a royalty value associated with the selected first structural design based at least on the structural value, the source identifier, and one or more additional parameters.

9. The method of claim 8, wherein the one or more additional parameters comprises one or more of a number of transmission of the selected first structural design, a type of transmission of the selected first structural design, or a recipient device intended to receive the selected first structural design.

10. The method of claim 8, wherein the additive manufacturing process includes an extrusion process.

11. The method of claim 8, wherein the additive manufacturing file further includes instructions for manipulating a print head of a three-dimensional printer.

12. The method of claim 8, wherein the structural value represents at least one of a strength criterion, a cost to build criterion, an aesthetic criterion, or a material grade.

13. The method of claim 8, further comprising updating the structural value of the first structural design based on at least a popularity of the first structural design, wherein the popularity is based at least on a number of user selections of the first structural design.

14. The method of claim 8, wherein the transmitting the additive manufacturing file in the predefined format comprises downloading the additive manufacturing file to a portable storage medium.

15. The method of claim 8, further comprising causing a plurality of transmission options to be displayed to the first user and receiving a selection of at least one of the plurality of transmission options, wherein the transmitting the additive manufacturing file in the predefined format is based on the selection of the at least one of the plurality of transmission options, and wherein the royalty value is variable based at least on the plurality of transmission options.

16. A computer-implemented method comprising:

receiving a plurality of design files at a computer-based system, wherein each of the design files is indicative of a respective structural design, a structural value associated with the respective structural design, and a source identifier associated with a designer of the respective structural design;

causing a graphical representation of at least a portion of the structural designs to be displayed to a user;

receiving a user selection of a first structural design of the displayed structural designs;

generating an additive manufacturing file indicative of the first structural design in a predefined format, wherein the predefined format is configured to enable processing of the additive manufacturing file into a physical structure through an additive manufacturing process, wherein the additive manufacturing file includes instructions configured to manipulate a print head of a three-dimensional printer to deposit material via the three-dimensional printer in a layer-by-layer manner;

transmitting the additive manufacturing file in the predefined format to the three-dimensional printer so as to enable the three-dimensional printer to deposit material via the three-dimensional printer in a layer-by-layer manner to build the structure according to the additive manufacturing file in the predefined format;

receiving, at the three-dimensional printer, an updated additive manufacturing file encoded with instructions to modify the structure on demand; and determining, by the computer based system, a royalty value associated with the selected first structural design based at least on the structural value, the source identifier, and one or more additional parameters.

17. The method of claim 16, wherein the one or more additional parameters comprises one or more of a number of transmission of the selected first structural design, a type of transmission of the selected first structural design, or a recipient device intended to receive the selected first structural design.

18. The method of claim 16, wherein the structural value represents at least one of a strength criterion, a cost to build criterion, an aesthetic criterion, or a material grade.

19. The method of claim 16, further comprising updating the structural value of the first structural design based on at least a popularity of the first structural design, wherein the popularity is based at least on a number of user selections of the first structural design.

20. The method of claim 16, further comprising causing a plurality of transmission options to be displayed to the user and receiving a selection of at least one of the plurality of transmission options, wherein the transmitting the selected first structural design in the predefined format is based on the selection of the at least one of the plurality of transmission options, and wherein the royalty value is variable based at least on the plurality of transmission options.

* * * * *